United States Patent
Jintyou et al.

(10) Patent No.: US 9,252,248 B2
(45) Date of Patent: *Feb. 2, 2016

(54) MANUFACTURING METHOD OF SEMICONDUCTOR DEVICE COMPRISING OXIDE SEMICONDUCTOR LAYER

(71) Applicant: Semiconductor Energy Laboratory Co., Ltd., Atsugi-shi, Kanagawa-ken (JP)

(72) Inventors: Masami Jintyou, Shimotsuga (JP); Yamato Aihara, Utsunomiya (JP); Katsuaki Tochibayashi, Tochigi (JP); Toru Arakawa, Shimotsuga (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/682,376

(22) Filed: Apr. 9, 2015

(65) Prior Publication Data

US 2015/0214343 A1    Jul. 30, 2015

Related U.S. Application Data

(60) Continuation of application No. 14/169,837, filed on Jan. 31, 2014, now Pat. No. 9,040,396, which is a division of application No. 13/220,761, filed on Aug. 30, 2011, now Pat. No. 8,664,097.

(30) Foreign Application Priority Data

Sep. 13, 2010 (JP) ................... 2010-204685

(51) Int. Cl.
*H01L 29/66* (2006.01)
*H01L 21/02* (2006.01)
(Continued)

(52) U.S. Cl.
CPC ...... *H01L 29/66969* (2013.01); *H01L 21/0237* (2013.01); *H01L 21/02554* (2013.01);
(Continued)

(58) Field of Classification Search
None
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 1770788 A | 4/2007 |

(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

(Continued)

*Primary Examiner* — Scott B Geyer
(74) *Attorney, Agent, or Firm* — Robinson Intellectual Property Law Office; Eric J. Robinson

(57) ABSTRACT

An object is to provide a technique by which a semiconductor device including a high-performance and high-reliable transistor is manufactured. A protective conductive film which protects an oxide semiconductor layer when a wiring layer is formed from a conductive layer is formed between the oxide semiconductor layer and the conductive layer, and an etching process having two steps is performed. In a first etching step, an etching is performed under conditions that the protective conductive film is less etched than the conductive layer and the etching selectivity of the conductive layer to the protective conductive film is high. In a second etching step, etching is performed under conditions that the protective conductive film is more easily etched than the oxide semiconductor layer and the etching selectivity of the protective conductive film to the oxide semiconductor layer is high.

12 Claims, 9 Drawing Sheets

(51) Int. Cl.

| | | |
|---|---|---|
| H01L 29/45 | (2006.01) | |
| H01L 29/786 | (2006.01) | |
| H01L 21/441 | (2006.01) | |
| H01L 21/4757 | (2006.01) | |
| H01L 29/04 | (2006.01) | |
| H01L 29/24 | (2006.01) | |

(52) U.S. Cl.
CPC .... *H01L21/02565* (2013.01); *H01L 21/02631* (2013.01); *H01L 21/441* (2013.01); *H01L 21/47573* (2013.01); *H01L 29/045* (2013.01); *H01L 29/24* (2013.01); *H01L 29/45* (2013.01); *H01L 29/66742* (2013.01); *H01L 29/7869* (2013.01); *H01L 29/78606* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,115,447 B2 | 10/2006 | Monoe |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,402,525 B2 | 7/2008 | Monoe |
| 7,405,425 B2 | 7/2008 | Kim et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,588,972 B2 | 9/2009 | Kim et al. |
| 7,674,650 B2 | 3/2010 | Akimoto et al. |
| 7,732,819 B2 | 6/2010 | Akimoto et al. |
| 7,767,106 B2 | 8/2010 | Chang |
| 7,977,169 B2 | 7/2011 | Hirao et al. |
| 8,129,717 B2 | 3/2012 | Yamazaki et al. |
| 8,471,252 B2 | 6/2013 | Yamazaki et al. |
| 8,481,362 B2 | 7/2013 | Lee |
| 8,664,097 B2 * | 3/2014 | Jintyou et al. ........... 438/488 |
| 8,729,544 B2 | 5/2014 | Yamazaki et al. |
| 8,785,241 B2 | 7/2014 | Sasagawa et al. |
| 8,900,917 B2 | 12/2014 | Yamazaki et al. |
| 9,040,396 B2 * | 5/2015 | Jintyou et al. ........... 438/488 |
| 9,087,745 B2 | 7/2015 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0315044 A1 | 12/2009 | Amundson et al. |
| 2010/0051922 A1 | 3/2010 | Hotta et al. |
| 2010/0065844 A1 | 3/2010 | Tokunaga |
| 2010/0092800 A1 | 4/2010 | Itagaki et al. |
| 2010/0102315 A1 | 4/2010 | Suzawa et al. |
| 2010/0105163 A1 | 4/2010 | Ito et al. |
| 2010/0109002 A1 | 5/2010 | Itagaki et al. |
| 2010/0123130 A1 | 5/2010 | Akimoto et al. |
| 2010/0163876 A1 | 7/2010 | Inoue et al. |
| 2010/0193782 A1 | 8/2010 | Sakata |
| 2011/0062436 A1 | 3/2011 | Yamazaki et al. |
| 2011/0068335 A1 | 3/2011 | Yamazaki et al. |
| 2011/0084266 A1 | 4/2011 | Yamazaki et al. |
| 2011/0084271 A1 | 4/2011 | Yamazaki et al. |
| 2011/0092017 A1 | 4/2011 | Akimoto et al. |
| 2012/0003797 A1 | 1/2012 | Sasagawa et al. |
| 2012/0025191 A1 | 2/2012 | Yamazaki |
| 2012/0108007 A1 | 5/2012 | Yamazaki et al. |

FOREIGN PATENT DOCUMENTS

| | | | |
|---|---|---|---|
| EP | 1983499 A | | 10/2008 |
| EP | 1995787 A | | 11/2008 |
| EP | 1998373 A | | 12/2008 |

(56) References Cited

FOREIGN PATENT DOCUMENTS

| | | |
|---|---|---|
| EP | 1998374 A | 12/2008 |
| EP | 1998375 A | 12/2008 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-026119 A | 1/2000 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-039746 A | 2/2004 |
| JP | 2004-103957 A | 4/2004 |
| JP | 2004-273614 A | 9/2004 |
| JP | 2004-273732 A | 9/2004 |
| JP | 2006-005116 A | 1/2006 |
| JP | 2006-165488 A | 6/2006 |
| JP | 2006-165528 A | 6/2006 |
| JP | 2006-165529 A | 6/2006 |
| JP | 2007-096055 A | 4/2007 |
| JP | 2007-123861 A | 5/2007 |
| JP | 2007-329298 A | 12/2007 |
| JP | 2008-042067 A | 2/2008 |
| JP | 2008-533693 | 8/2008 |
| JP | 2009-111190 A | 5/2009 |
| JP | 2010-056539 A | 3/2010 |
| JP | 2010-062547 A | 3/2010 |
| JP | 2010-525603 | 7/2010 |
| KR | 2007-0110320 A | 11/2007 |
| KR | 2008-0106900 A | 12/2008 |
| WO | WO-2004/114391 | 12/2004 |
| WO | WO-2007/094501 | 8/2007 |
| WO | WO-2008/133457 | 11/2008 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)5$ films", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(56) References Cited

OTHER PUBLICATIONS

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS", IDW '09 : Proceedings of the 16th International Display Workshops, 2009, pp. 689-692.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTS With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies In ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Kamiya.T et al., "Carrier transport properties and electronic structures of amorphous oxide semiconductors: the present status", Solid State Physics, Sep. 1, 2009, vol. 44, No. 9, pp. 621-633, Agne Gijutsu Center.

Korean Office Action (Application No. 2011-0091880) Dated Jun. 26, 2014.

* cited by examiner

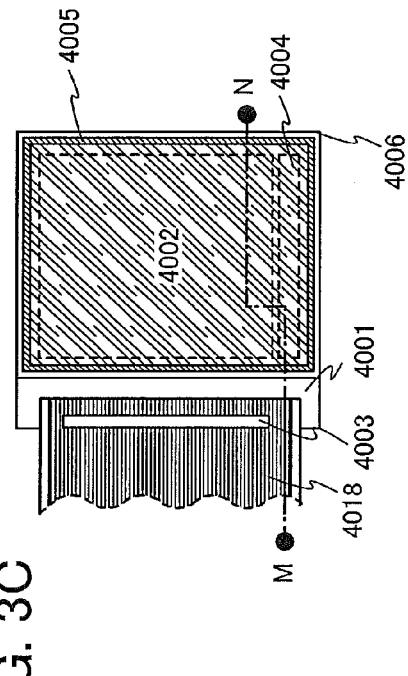
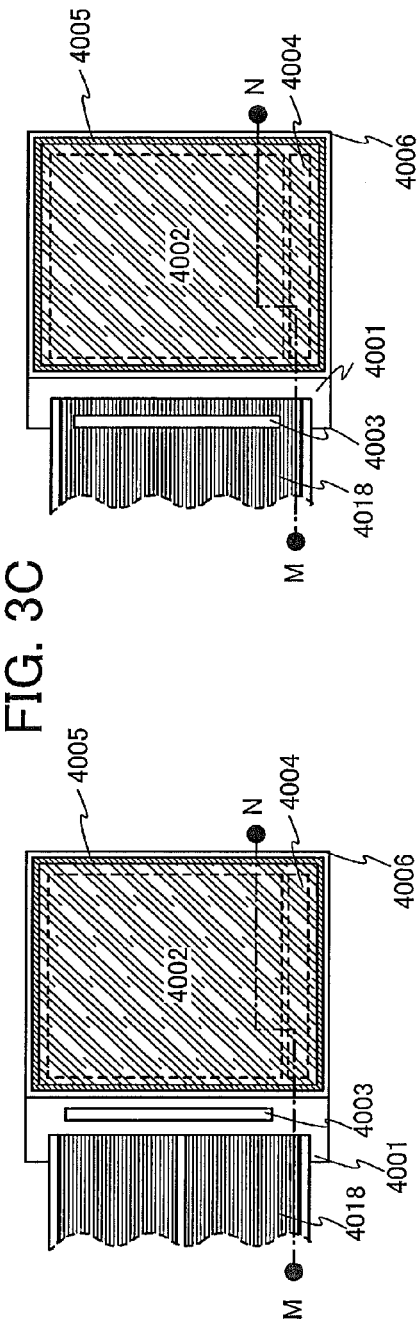
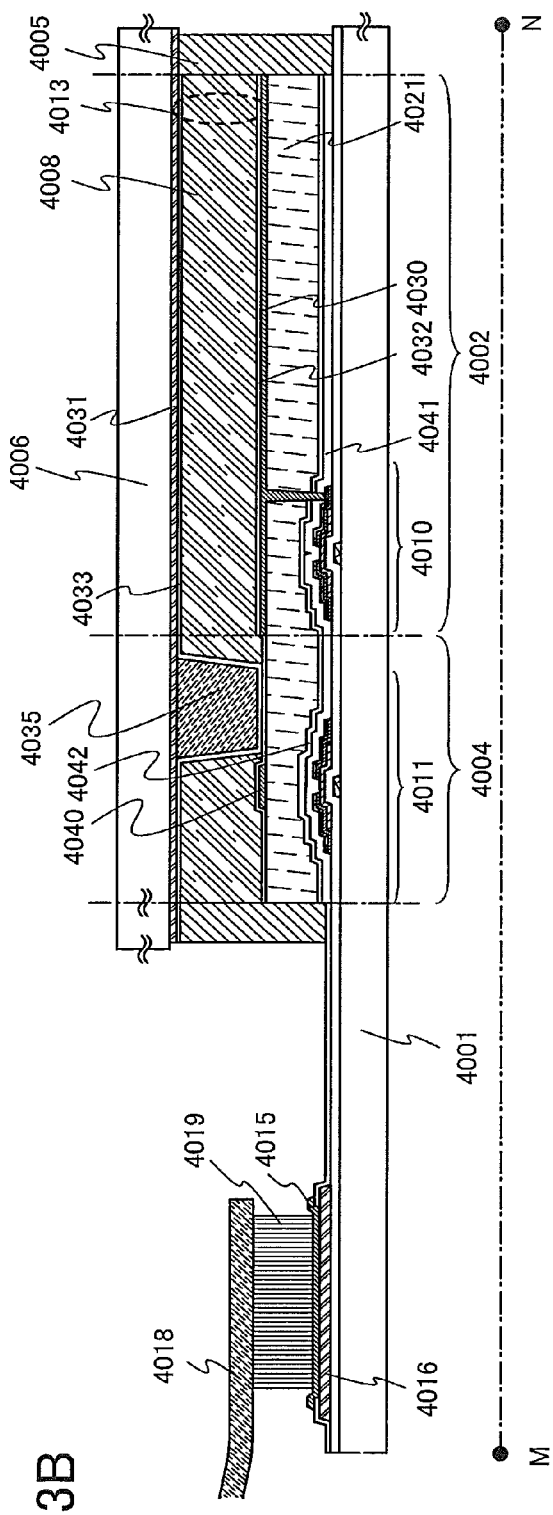

MANUFACTURING METHOD OF SEMICONDUCTOR DEVICE COMPRISING OXIDE SEMICONDUCTOR LAYER

BACKGROUND OF THE INVENTION

1. Field of the Invention

An embodiment of the present invention relates to a semiconductor device and a manufacturing method thereof.

2. Description of the Related Art

In recent years, oxide semiconductors having semiconductor characteristics have attracted attentions. The oxide semiconductors having semiconductor characteristics can be applied to transistors.

Variety kinds of etching methods have been considered in order to form a desirable shape of an oxide semiconductor with a reproducible etching method. In a variety of processing methods of a film which includes an oxide semiconductor containing In, Ga, and Zn, a technique by which an oxide semiconductor layer of a transistor is etched with a halogen-based gas has been reported (see Patent Document 1).

REFERENCE

[Patent Document 1] Japanese Published Patent Application No. 2008-042067

SUMMARY OF THE INVENTION

There is a transistor in which a wiring layer is provided over a semiconductor layer, and in a manufacturing process of such a transistor, the wiring layer is formed by etching a conductive layer. Also, in etching of the conductive layer over the semiconductor layer, a halogen-based gas is used.

Thus, in the above structure, when an oxide semiconductor layer is used as the semiconductor layer, the oxide semiconductor layer could possibly be etched together while the conductive layer is etched.

By etching of the oxide semiconductor layer in such a manner, the thickness of the oxide semiconductor layer is ununiform, and variation in transistor characteristics is caused, which results in reduction of the reliability.

An object as for a manufacturing method of a semiconductor device including a transistor using an oxide semiconductor is to provide a technique by which the etching amount of an oxide semiconductor layer provided below a conductive layer, in an etching step of the conductive layer, is reduced.

Another object is as for a manufacturing method of a semiconductor device including a transistor using an oxide semiconductor is to provide a technique by which an adverse affect on the transistor characteristics due to a reduction in the thickness of the oxide semiconductor layer is reduced.

Another object is to provide a technique by which a semiconductor device including a high-performance and high-reliable transistor is manufactured.

In a manufacturing method of a semiconductor device in which a wiring layer is stacked over an oxide semiconductor layer, the wiring layer is formed by etching a conductive layer. A protective conductive film for protecting the oxide semiconductor layer in etching of the conductive layer is formed between the oxide semiconductor layer and the conductive layer.

A process in which the protective conductive film and the conductive layer formed over the oxide semiconductor layer are etched includes two steps. The etching process including two steps includes a first etching step in which the conductive layer is etched and a second etching step in which the protective conductive film is etched until the oxide semiconductor layer provided below is exposed.

The protective conductive film is preferably a film which is less etched in the first etching step than the conductive layer because the protective conductive film serves as an etching stopper for preventing the oxide semiconductor layer from being etched together with the conductive layer, and which is more easily etched in the second etching step than the oxide semiconductor layer so that the protective conductive film can be removed so as not to leave a residue in an exposed region of the oxide semiconductor layer.

Thus, the first etching step is performed under a condition that the etching selectivity of the conductive layer to the protective conductive film is high, and the second etching step is performed under a condition that the etching selectivity of the protective conductive film to the oxide semiconductor layer is high.

In this specification, the term "etching selectivity of A to B" is defined as a value obtained by dividing the etching rate of A by the etching rate of B. For example, "the etching selectivity of the conductive layer to the protective conductive film" means the value obtained by dividing the etching rate of the conductive film by the etching rate of the protective conductive film. Further in this specification, "the etching selectivity is high" means that the etching selectivity is greater than 1.

Since the etching selectivity of the conductive layer to the protective conductive film is high, the protective conductive film can serve as an etching stopper even if the thickness of the protective conductive film is small.

Reduction in the thickness of the protective conductive film enables a time for etching the protective conductive film to be shortened.

The first etching step is preferably performed using a chlorine-based gas, and the second etching step is preferably performed using a mixed gas of a chlorine-based gas and a fluorine-based gas.

Specifically, examples of a chlorine-based gas include a mixed gas of $BCl_3$ and $Cl_2$. Examples of a mixed gas of a chlorine-based gas and a fluorine-based gas include a mixed gas of $SF_6$ and $Cl_2$.

As preferred embodiments of a manufacturing method of a semiconductor device disclosed in this specification, specific structures are described below.

An embodiment of a manufacturing method of a semiconductor device disclosed in this specification includes the steps of forming a gate electrode layer; forming a gate insulating film over the gate electrode layer; forming an oxide semiconductor layer over the gate insulating film; forming a protective conductive film over the oxide semiconductor layer; forming a conductive layer over the protective conductive film; forming a resist mask over the conductive layer; etching the conductive layer selectively with use of the resist mask and a chlorine-based gas (a first etching step), so that the protective conductive film is exposed; etching the protective conductive film selectivity with use of the resist mask and a mixed gas of a chlorine-based gas and a fluorine-based gas (a second etching step), so that the oxide semiconductor layer is exposed and a wiring layer is formed; and forming an insulating film over the oxide semiconductor layer, the protective conductive film, and the wiring layer. The first etching step is performed under a condition that the protective conductive film is less etched than the conductive layer and the etching selectivity of the conductive layer to the protective conductive film is high. The second etching step is performed under a condition that the protective conductive film is more easily etched than the oxide semiconductor layer and the etching selectivity of the protective conductive film to the oxide semiconductor layer is high.

An embodiment of a manufacturing method of a semiconductor device disclosed in this specification includes the steps of forming an oxide semiconductor layer; forming a protective conductive film over the oxide semiconductor layer; forming a conductive layer over the protective conductive film; forming a resist mask over the conductive layer; etching the conductive layer selectively with use of the resist mask and a chlorine-based gas (a first etching step), so that the protective conductive film is exposed; etching the protective conductive film selectively with use of the resist mask and a mixed gas of a chlorine-based gas and a fluorine-based gas (a second etching step), so that the oxide semiconductor layer is exposed and a wiring layer is formed; forming a gate insulating film over the wiring layer; and forming a gate electrode layer over the gate insulating film so as to overlap with the oxide semiconductor layer. The first etching step is performed under a condition that the protective conductive film is less etched than the conductive layer and the etching selectivity of the conductive layer to the protective conductive film is high. The second etching step is performed under a condition that the protective conductive film is more easily etched than the oxide semiconductor layer and the etching selectivity of the protective conductive film to the oxide semiconductor layer is high.

In an embodiment of the manufacturing method of a semiconductor device disclosed in this specification, for example, the thickness of the protective conductive film is preferably less than or equal to the thickness of the oxide semiconductor layer.

In an embodiment of the manufacturing method of a semiconductor device disclosed in this specification, for example, the first etching step may be performed under a condition that the etching selectivity of the conductive layer to the protective conductive film is higher than or equal to 4, preferably higher than or equal to 6, and the second etching step may be performed under a condition that the etching selectivity of the protective conductive film to the oxide semiconductor layer is higher than or equal to 30, preferably higher than or equal to 45.

In an embodiment of the manufacturing method of a semiconductor device disclosed in this specification, for example, the wiring layer is preferably formed to have a stacked structure including a film including aluminum as a material.

In an embodiment of the manufacturing method of a semiconductor device disclosed in this specification, for example, the wiring layer is preferably formed to have a stacked structure in which a titanium film is provided below the film including aluminum.

In an embodiment of the manufacturing method of a semiconductor device disclosed in this specification, for example, the protective conductive film is preferably formed using a tungsten film.

In an embodiment of the manufacturing method of a semiconductor device disclosed in this specification, for example, the oxide semiconductor layer is preferably formed using a film containing indium, gallium, and zinc.

By etching the conductive layer with high etching selectivity, etching of the oxide semiconductor layer can be reduced.

Since the etching step can be controlled with high accuracy, a transistor including a thin oxide semiconductor layer, which is difficult to be normally-on, can be manufactured.

Further, a semiconductor device including a high-performance and high-reliable transistor in which generation of variation in the thickness of the oxide semiconductor layer can be reduced and the leakage current of the transistor can be suppressed, can be manufactured.

BRIEF DESCRIPTION OF THE DRAWINGS

FIGS. 3A and 3C are plan views of semiconductor devices and FIG. 3B is a cross-sectional view thereof.

DETAILED DESCRIPTION OF THE INVENTION

Figure 1A:
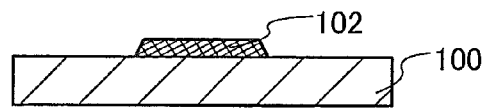
FIGS. 1A to 1G are cross-sectional views illustrating a manufacturing method of a semiconductor device.

Hereinafter, embodiments of the present invention will be described in detail with reference to the accompanying drawings. Note that the present invention is not limited to the description below, and it is easily understood by those skilled in the art that a variety of changes and modifications can be made without departing from the spirit and scope of the present invention. Accordingly, the present invention should not be construed as being limited to the description of the embodiments below. In describing structures of the present invention with reference to the drawings, the same reference numerals are used in common for the same portions in different drawings. The same hatching pattern may be applied to similar parts, and the similar parts may not be especially denoted by reference numerals in some cases. In addition, for convenience, an insulating layer may, in some cases, not be illustrated in plan views.

Furthermore, hereinafter, ordinal numbers, such as "first" and "second," are used merely for convenience, and the present invention is not limited to the numbers.

Embodiment 1

In this embodiment, a manufacturing method of a semiconductor device including a transistor according to an embodiment of the present invention will be described.

First, a gate electrode layer 102 is selectively formed over a substrate 100 (see FIG. 1A).

The substrate 100 may have an insulating surface. For example, a glass substrate, a quartz substrate, a semiconductor substrate having an insulating layer formed on its surface, or a stainless steel substrate having an insulating layer formed on its surface may be used.

The gate electrode layer 102 may be formed using a conductive material. A conductive material film to be the gate electrode layer 102 is formed and processed by a photolithography method.

Figure 1B:
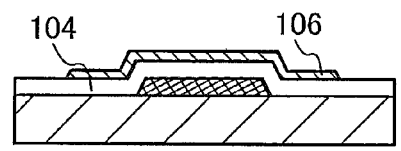

A gate insulating film 104 is formed to cover the gate electrode layer 102, and an oxide semiconductor layer 106 is selectively formed over the gate insulating film 104 (see FIG. 1B).

The gate insulating film 104 is preferably formed using silicon oxide, silicon nitride, silicon oxynitride, or silicon nitride oxide by a sputtering method. This is because moisture and hydrogen are preferably removed as much as possible from the gate insulating film 104 in contact with the oxide semiconductor layer 106. The gate insulating film 104 may be a single layer or a stack of a plurality of layers.

Note that "silicon oxynitride" refers to a substance that contains more oxygen than nitrogen, and contains oxygen, nitrogen, and silicon at 50 at. % to 70 at. %, 0.5 at. % to 15 at. %, and 25 at. % to 35 at. %, respectively in the case where measurements are performed using Rutherford backscattering spectrometry (RBS) and hydrogen forward scattering spectrometry (HFS).

Note that "silicon nitride oxide" refers to a substance that contains more nitrogen than oxygen, and in the case where measurements are performed using RBS and HFS, preferably contains oxygen, nitrogen, and silicon at 5 at. % to 30 at. %, 20 at. % to 55 at. %, and 25 at. % to 35 at. %, respectively. Note that percentages of nitrogen, oxygen, and silicon fall within the ranges given above, where the total number of atoms contained in the silicon oxynitride film or the silicon nitride oxide film is defined as 100 at. %.

Further, it is preferable that the gate insulating film 104 be formed to include aluminum oxide, tantalum oxide, hafnium oxide, yttrium oxide, hafnium silicate ($HfSi_xO_y$ (x>0, y>0)), hafnium silicate ($HfSi_xO_y$ (x>9, y>0)) to which nitrogen is added, or hafnium aluminate ($HfAl_xO_y$ (x>0, y>0)) to which nitrogen is added. There is no particular limitation on the thickness; however, in the case where a semiconductor device is miniaturized, the thickness is preferably small for ensuring operation of the transistor. For example, in the case where silicon oxide is used, the thickness can be set to greater than or equal to 1 nm and less than or equal to 100 nm, preferably greater than or equal to 10 nm and less than or equal to 50 nm.

When the gate insulating film is formed thin as described above, gate leakage due to a tunnel effect or the like becomes a problem. In order to solve the problem of gate leakage, the gate insulating film 104 may be formed using a high dielectric constant (high-k) material such as hafnium oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, or hafnium aluminate ($HfAl_xO_y$ (x>0, y>0)) to which nitrogen is added. The use of a high-k material for the gate insulating film 104 makes it possible to increase the thickness in order to suppress gate leakage as well as ensuring electric characteristics. Note that a stacked structure of a film containing a high-k material and a film containing any one of silicon oxide, silicon nitride, silicon oxynitride, silicon nitride oxide, aluminum oxide, and the like may be employed.

For forming the oxide semiconductor layer 106, an intrinsic (i-type) or substantially intrinsic (i-type) oxide semiconductor is used. Such an i-type or substantially i-type oxide semiconductor is obtained as follows: an oxide semiconductor is highly purified by removing impurities such as water or hydrogen and preventing impurities to be donors or acceptors other than main components of the oxide semiconductor to be contained as much as possible; and oxygen is sufficiently supplied to the oxide semiconductor.

As described above, the oxide semiconductor layer 106 used in the transistor is desirably a highly purified oxide semiconductor layer formed by sufficiently removing impurities such as hydrogen and supplied with oxygen sufficiently. Specifically, the concentration of hydrogen in the oxide semiconductor layer 106 is lower than or equal to $5\times10^{19}$ atoms/$cm^3$, preferably lower than or equal to $5\times10^{18}$ atoms/$cm^3$, further preferably lower than or equal to $5\times10^{17}$ atoms/$cm^3$, for example. Note that the concentration of hydrogen in the oxide semiconductor layer 106 is measured by secondary ion mass spectrometry (SIMS). In the oxide semiconductor layer 106 which is highly purified by sufficiently reducing the hydrogen concentration therein and in which a defect level in an energy gap due to oxygen deficiency is reduced by supplying a sufficient amount of oxygen, the carrier concentration is lower than $1\times10^{12}/cm^3$, preferably lower than $1\times10^{11}/cm^3$, further preferably lower than $1.45\times10^{10}/cm^3$. For example, the off-state current (here, current per micrometer (m) of channel width) at room temperature (25° C.) is lower than or equal to 100 zA (1 zA (zeptoampere) is $1\times10^{-21}$ A), preferably lower than or equal to 10 zA. In this manner, by using an i-type (intrinsic) or substantially i-type oxide semiconductor layer 106, the transistor having extremely favorable off-state current characteristics can be obtained.

In addition, the concentration of sodium in the oxide semiconductor layer 106 is lower than or equal to $5\times10^{16}$ atoms/$cm^3$, preferably lower than or equal to $1\times10^{16}$ atoms/$cm^3$, further preferably lower than or equal to $1\times10^{15}$ atoms/$cm^3$. The concentration of lithium in the oxide semiconductor layer 106 is lower than or equal to $5\times10^{15}$ atoms/$cm^3$, preferably lower than or equal to $1\times10^{15}$ atoms/$cm^3$. The concentration of potassium in the oxide semiconductor layer 106 is lower than or equal to $5\times10^{15}$ atoms/$cm^3$, preferably lower than or equal to $1\times10^{15}$ atoms/$cm^3$. Note that the sodium concentration, the lithium concentration, and the potassium concentration in the oxide semiconductor layer 106 are measured by secondary ion mass spectrometry. An alkali metal and an alkaline earth metal are adverse impurities for an oxide semiconductor and are preferably contained little. When an insulating film in contact with the oxide semiconductor is an oxide, an alkali metal, in particular, sodium diffuses into the insulating film and becomes $Na^+$. In addition, Na cuts a bond between metal and oxygen or enters the bond in the oxide semiconductor. As a result, transistor characteristics deteriorate (e.g., the transistor becomes normally-on (the shift of a threshold voltage to a negative side) or the mobility is decreased). In addition, this also causes variation in the characteristics. Such a problem is significant especially in the case where the hydrogen concentration in the oxide semiconductor is extremely low. Therefore, the concentration of an alkali metal is strongly required to set to the above value in the case where the hydrogen concentration in the oxide semiconductor is lower than or equal to $5\times10^{19}$ $cm^{-3}$, particularly lower than or equal to $5\times10^{18}$ $cm^{-3}$.

It is important that the state of the interface (interface state, interface charge, and the like) between the gate insulating film 104 and the oxide semiconductor layer 106 be adjusted to be appropriate because such a highly purified oxide semiconductor is very sensitive to the interface state and interface charge. Thus, it is preferable that the gate insulating film 104 which is in contact with the highly purified oxide semiconductor has high quality. Here, the "gate insulating film 104 has high quality" means that there are few defects on the surface or inside of the gate insulating film 104 and few defect levels and interface states which trap charge, and it is difficult to generate a fixed charge.

The gate insulating film 104 formed by, for example, high-density plasma CVD using microwave (for example, a frequency of 2.45 GHz) can be a dense layer with high withstand voltage, which is preferable. The highly purified oxide semiconductor layer and the high-quality gate insulating film are provided to be in close contact with each other, so that the interface state density can be reduced and favorable interface characteristics can be obtained.

Needless to say, another film formation method such as a sputtering method or a plasma CVD method can be employed as long as it enables formation of a high-quality insulating layer as the gate insulating film 104.

Further, the gate insulating film 104 in contact with the oxide semiconductor layer 106 may be formed using an insulating material including a Group 13 element and oxygen. There are a great number of materials including a Group 13 element among oxide semiconductor materials, and an insulating material including a Group 13 element has a good compatibility with an oxide semiconductor. By using an insulating material including a Group 13 element for the insulating layer in contact with the oxide semiconductor layer, an interface with the oxide semiconductor layer can keep a favorable state. In addition, an insulating film 116 serving as a protective film of the oxide semiconductor film, described later, may also be formed using an insulating material including a Group 13 element and oxygen.

An insulating material including a Group 13 element refers to an insulating material including one or more Group 13 elements. As the insulating material including a Group 13 element, a gallium oxide, an aluminum oxide, an aluminum gallium oxide, a gallium aluminum oxide, and the like are given. Here, aluminum gallium oxide refers to a substance that contains aluminum (atomic %) more than gallium (atomic %), and gallium aluminum oxide refers to a substance that contains gallium (atomic %) more than aluminum (atomic %).

For example, in the case of forming a gate insulating film in contact with an oxide semiconductor film containing gallium, a material containing gallium oxide is used for the gate insulating film, so that favorable characteristics can be kept at the interface between the oxide semiconductor layer and the gate insulating film. When the oxide semiconductor layer and the insulating layer containing gallium oxide are provided in contact with each other, hydrogen pile-up at the interface between the oxide semiconductor layer and the insulating layer can be reduced, for example. Note that a similar effect can be obtained in the case where an element belonging to the same group as a constituent element of the oxide semiconductor is used for the insulating layer. For example, it is effective to form an insulating layer with use of a material containing an aluminum oxide. Note that water hardly permeates an aluminum oxide. Thus, it is preferable to use a material containing an aluminum oxide in terms of preventing entry of water to the oxide semiconductor layer.

In the insulating layer in contact with the oxide semiconductor layer 106, e.g., the gate insulating film 104, an insulating material preferably includes oxygen whose proportion is higher than the stoichiometry by performing heat treatment in an oxygen atmosphere or oxygen doping. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed using an ion implantation method or an ion doping method.

For example, in the case where the insulating layer in contact with the oxide semiconductor layer 106 is formed using gallium oxide, the composition of gallium oxide can be set to be $Ga_2O_x$ ($x=3+\alpha$, $0<\alpha<1$) by performing heat treatment in an oxygen atmosphere or oxygen doping. In the case where the insulating layer in contact with the oxide semiconductor layer 106 is formed using aluminum oxide, the composition of aluminum oxide can be set to be $Al_2O_x$ ($x=3+\alpha$, $0<\alpha<1$) by performing heat treatment in an oxygen atmosphere or oxygen doping. In the case where the insulating layer in contact with the oxide semiconductor layer 106 is formed using gallium aluminum oxide (or aluminum gallium oxide), the composition of gallium aluminum oxide (or aluminum gallium oxide) can be set to be $Ga_xAl_{2-x}O_{3+\alpha}$ ($0<x<2$, $0<\alpha<1$) by heat treatment in an oxygen atmosphere or oxygen doping.

By oxygen doping or the like, an insulating layer which includes a region where the proportion of oxygen is higher than the stoichiometry can be formed. When the insulating layer including such a region is in contact with the oxide semiconductor layer, oxygen that exists excessively in the insulating layer is supplied to the oxide semiconductor layer, and oxygen deficiency in the oxide semiconductor layer subjected to dehydration or dehydrogenation or at the interface between the oxide semiconductor layer and the insulating layer is reduced. Thus, the oxide semiconductor layer can be formed to be an intrinsic (i-type) or substantially intrinsic oxide semiconductor.

The insulating layer including a region where the proportion of oxygen is higher than the stoichiometry may be employed for an insulating film for forming a protective film of the oxide semiconductor layer 106 (for example, the insulating film 116 described later) instead of the gate insulating film 104 or may be employed for both the gate insulating film 104 and the insulating film for forming a protective film.

An oxide semiconductor to be used preferably contains at least indium (In) or zinc (Zn). In particular, In and Zn are preferably contained. As a stabilizer for reducing variation in electric characteristics among transistors using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor for the oxide semiconductor layer 106, any of the following oxides can be used: a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide; a three-component metal oxide such as an In—Ga—Zn-based oxide (also referred to as IGZO), an In—Al—Zn-based oxide, an In—Sn—Zn-based oxide, an Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; or a single-component metal oxide such as an indium oxide, a tin oxide, or a zinc oxide. Note that an "In—Ga—Zn-based oxide" means an oxide containing In, Ga, and Zn as its main component, in which there is no particular limitation on the ratio of In:Ga:Zn. The In—Ga—Zn-based oxide may contain a metal element other than the In, Ga, and Zn.

As the oxide semiconductor layer 106, a thin film expressed by a chemical formula of $InMO_3(ZnO)_m$ ($m>0$, where m is not an integer) can be used. Here, M represents one or more metal elements selected from Zn, Ga, Al, Mn, or Co. For example, M can be Ga, Ga and Al, Ga and Mn, Ga and Co, or the like.

Moreover, an In—Ga—Zn-based oxide film is formed by using an oxide semiconductor target where $In_2O_3:Ga_2O_3:ZnO$ is 1:1:1 (mole ratio) for example, as a target for forming the thin film of the oxide semiconductor to form the oxide semiconductor layer 106 by sputtering. Note that it is not necessary to limit the material and the composition ratio of the target to the above. For example, an oxide semiconductor film formation target with the following composition ratio may alternatively be used: the composition ratio where $In_2O_3:Ga_2O_3:ZnO$ is 1:1:2 [molar ratio]. Here, for example, an In—Ga—Zn-based oxide semiconductor means an oxide film containing indium (In), gallium (Ga), and zinc (Zn), and there is no particular limitation on the composition ratio.

In the case where an In—Zn-based oxide material is used as an oxide semiconductor, a target therefor has the following composition ratio: In:Zn=50:1 to 1:2 in an atomic ratio ($In_2O_3:ZnO$=25:1 to 1:4 in a molar ratio), preferably, In:Zn=20:1 to 1:1 in an atomic ratio ($In_2O_3:ZnO$=10:1 to 1:2 in a molar ratio), further preferably, In:Zn=15:1 to 1.5:1 in an atomic ratio ($In_2O_3:ZnO$=15:2 to 3:4 in a molar ratio). For example, in a target used for formation of an In—Zn—O-based oxide semiconductor, an atomic ratio of In:Zn:O is X:Y:Z, where Z>1.5X+Y.

Further, an In—Sn—Zn-based oxide can be referred to as ITZO. An oxide target which has a composition ratio where In:Sn:Zn is 1:2:2, 2:1:3, 1:1:1, 20:45:35, or the like in an atomic ratio is used.

The thickness of the semiconductor film to be the oxide semiconductor layer 106 is desirably greater than or equal to 3 nm and less than or equal to 30 nm. This is because the transistor might possibly be normally on when the semiconductor film to be the oxide semiconductor layer 106 is too thick (e.g., the thickness is greater than or equal to 50 nm).

Here, the semiconductor film to be the oxide semiconductor layer 106 is formed by a sputtering method using a target for an In—Ga—Zn—O-based oxide semiconductor in a reduced-pressure atmosphere.

In addition, the filling factor of the oxide semiconductor target for film formation is greater than or equal to 90% and less than or equal to 100%, preferably greater than or equal to 95% and less than or equal to 99.9%. With use of the target having a high filling factor, the oxide semiconductor film to be formed can be a dense film.

For example, the oxide semiconductor layer can be formed as follows.

First, the substrate is held in a deposition chamber which is kept under reduced pressure, and then is heated so that the substrate temperature reaches a temperature higher than 200° C. and lower than or equal to 500° C., preferably higher than 300° C. and lower than or equal to 500° C., further preferably higher than or equal to 350° C. and lower than or equal to 450° C.

Then, a high-purity gas from which impurities such as hydrogen, water, a hydroxyl group, or a hydride are sufficiently removed is introduced into the deposition chamber from which remaining moisture is being removed, and the oxide semiconductor layer is formed over the substrate with use of the target. To remove moisture remaining in the deposition chamber, an entrapment vacuum pump such as a cryopump, an ion pump, or a titanium sublimation pump is desirably used. Further, an evacuation unit may be a turbo pump provided with a cold trap. In the deposition chamber which is evacuated with the cryopump, for example, impurities such as hydrogen, water, a hydroxyl group, or a hydride (preferably, also a compound containing a carbon atom) or the like are removed, whereby the concentration of impurities such as hydrogen, water, a hydroxyl group, or a hydride in the oxide semiconductor layer formed in the deposition chamber can be reduced.

In the case where the substrate temperature is low (for example, 100° C. or lower) during deposition, a substance including a hydrogen atom may enter the oxide semiconductor; thus, it is preferable that the substrate be heated at a temperature in the above range. When the oxide semiconductor layer is formed while the substrate is heated at the above temperature, the substrate temperature is increased, and hydrogen bonds are cut by heat, so that the substance including a hydrogen atom is less taken into the oxide semiconductor layer. Therefore, the oxide semiconductor layer is formed with the substrate heated at the above temperature, whereby the concentration of impurities such as hydrogen, water, a hydroxyl group, or a hydride in the oxide semiconductor layer can be sufficiently reduced. In addition, damage to the oxide semiconductor layer due to sputtering can be reduced.

As an example of the deposition conditions, the following conditions can be employed: the distance between the substrate and the target is 60 mm, the pressure is 0.4 Pa, the direct-current (DC) power source is 0.5 kW, the substrate temperature is 400° C., and the deposition atmosphere is an oxygen atmosphere (the proportion of the oxygen flow rate is 100%). Note that a pulsed direct current power source is preferable because powder substances (also referred to as particles or dust) generated in deposition can be reduced and the distribution of the film thicknesses can be small.

Note that before the oxide semiconductor layer is formed by a sputtering method, powdery substances (also referred to as particles or dust) attached on a formation surface of the oxide semiconductor layer are preferably removed by reverse sputtering in which an argon gas is introduced and plasma is generated. The reverse sputtering refers to a method in which a voltage is applied to a substrate side to generate plasma in the vicinity of the substrate to modify a surface. Note that instead of argon, a gas of nitrogen, helium, oxygen or the like may be used.

Dehydration or dehydrogenation may be performed in advance by performing preheating before the oxide semiconductor layer 106 is formed.

It is preferable that remaining moisture and hydrogen in the deposition chamber be sufficiently removed before the semiconductor film to be the oxide semiconductor layer 106 is formed. That is, before formation of the semiconductor film to be the oxide semiconductor layer 106, evacuation is preferably performed with an entrapment vacuum pump such as a cryopump, an ion pump, or a titanium sublimation pump.

The oxide semiconductor layer may have a stacked-layer structure including a second crystalline oxide semiconductor layer which is thicker than a first crystalline oxide semiconductor layer over the first crystalline oxide semiconductor layer. The oxide semiconductor layer having such a stacked layer can be formed by the following method.

First, a first crystalline oxide semiconductor layer is formed to a thickness greater than or equal to 1 nm and less than or equal to 10 nm over the gate insulating film 104. The first crystalline oxide semiconductor layer is formed by a sputtering method, and the substrate temperature in the film formation by a sputtering method is set to be higher than or equal to 200° C. and lower than or equal to 400° C. Next, a first heat treatment is performed by setting the atmosphere of a chamber in which the substrate is placed to an atmosphere of nitrogen or dry air. The temperature of the heat treatment is higher than or equal to 400° C. and lower than or equal to 750° C.

Depending on the substrate temperature at the time or deposition and the temperature of the first heat treatment, the deposition or the heat treatment causes crystallization from a film surface and crystal grows from the film surface toward the inside of the film; thus, c-axis aligned crystals are obtained. By the first heat treatment, large amounts of zinc and oxygen gather to the film surface, and one or more layers of graphene-type two-dimensional crystal including zinc and oxygen and having a hexagonal upper plane are formed at the outermost surface; the layer or layers at the outermost surface grow in the thickness direction to form a stack of layers. By increasing the temperature of the heat treatment, crystal growth proceeds from the surface to the inside and further from the inside to the bottom.

Then, a second oxide semiconductor layer with a thickness greater than 10 nm is formed over the first crystalline oxide semiconductor layer. The second oxide semiconductor layer is formed by a sputtering method, and the substrate temperature in the film formation is set to be higher than or equal to 200° C. and lower than or equal to 400° C. By setting the substrate temperature in the film formation to be higher than or equal to 200° C. and lower than or equal to 400° C., precursors can be arranged in the oxide semiconductor layer formed over and in contact with the surface of the first crystalline oxide semiconductor layer and so-called orderliness can be obtained.

Next, a second heat treatment is performed by setting the atmosphere of a chamber in which the substrate is placed to an atmosphere of nitrogen or dry air. The temperature of the heat treatment is higher than or equal to 400° C. and lower than or equal to 750° C. By this heat treatment, the second crystalline oxide semiconductor layer is formed. The second heat treatment is performed in a nitrogen atmosphere, an oxygen atmosphere, or a mixed atmosphere of nitrogen and oxygen, whereby the density of the second crystalline oxide semiconductor layer is increased and the number of defects therein is reduced. By the second heat treatment, crystal growth proceeds in the thickness direction with use of the first crystalline oxide semiconductor layer as a nucleus, that is, crystal growth proceeds from the bottom to the inside; thus, the second crystalline oxide semiconductor layer is formed.

A feature of the first crystalline oxide semiconductor layer and the second crystalline oxide semiconductor layer obtained by the above formation method is that they have c-axis alignment. The first crystalline oxide semiconductor layer and the second crystalline oxide semiconductor layer comprise an oxide including crystals having c-axis alignment (also referred to as C-Axis Aligned Crystal (CAAC)). The first crystalline oxide semiconductor layer and the second crystalline oxide semiconductor layer partly include a crystal grain boundary.

In a broad sense, an oxide including CAAC means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not single crystal, but this does not mean that the CAAC is composed of only an amorphous component. Although the CAAC includes a crystallized portion (crystalline portion), a boundary between one crystalline portion and another crystalline portion may not be clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

By forming a transistor with use of such a stack of a first crystalline oxide semiconductor layer and a second crystalline oxide semiconductor layer, the transistor can have stable electric characteristics and high reliability.

The oxide semiconductor layer can be processed by being etched after a mask having a desired shape is formed over the oxide semiconductor layer. The mask may be formed by a method such as photolithography or an ink jet method. For the etching of the oxide semiconductor layer, either wet etching or dry etching may be employed. It is needless to say that both of them may be employed in combination.

Next, a heat treatment (a third heat treatment) is performed on the oxide semiconductor layer 106. Dehydration or dehydrogenation of the oxide semiconductor layer can be performed through the heat treatment. The heat treatment is performed in an inert atmosphere at a temperature higher than or equal to 250° C. and lower than or equal to 700° C., preferably higher than or equal to 450° C. and lower than or equal to 600° C. Note that the preferable temperature of the heat treatment is lower than the strain point of the substrate. In this embodiment, the heat treatment is performed in a nitrogen atmosphere at 450° C. for an hour. Note that there is no particular limitation on timing of the heat treatment as long as it is after formation of the oxide semiconductor layer 106. Further, the atmosphere for performing the heat treatment may be a mixed gas atmosphere containing an oxygen gas and a nitrogen gas, an oxygen gas atmosphere, and an atmosphere from which moisture is sufficiently removed (dry air), instead of a nitrogen gas atmosphere. After the heat treatment, it is preferable that the oxide semiconductor layer 106 be not exposed to air so that water or hydrogen be prevented from reentering the oxide semiconductor layer 106.

Further, a fourth heat treatment may be performed on the oxide semiconductor layer which has been subjected to the third heat treatment. By performing the fourth heat treatment in an oxidation atmosphere, oxygen is supplied to the oxide semiconductor layer; oxygen deficiency caused in the oxide semiconductor layer by the third heat treatment is accordingly compensated. Thus, the fourth heat treatment may be referred to as an oxygen supplying treatment. The fourth heat treatment may be performed at, for example, higher than or equal to 200° C. and lower than a strain point of the substrate, preferably higher than or equal to 250° C. and lower than or equal to 450° C. The treatment time is from three minutes to 24 hours. The ratio of a crystalline region to an amorphous region in the oxide semiconductor layer can be increased as the treatment time is prolonged. However, a heat treatment time longer than 24 hours is not preferable because productivity is decreased.

In such a manner, an oxide semiconductor layer in which impurities are reduced by performing the heat treatments is formed, whereby a transistor having extremely excellent characteristics can be realized.

Figure 1C:
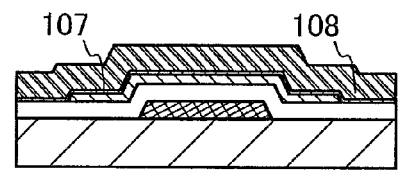

Next, a protective conductive film 107 is formed to cover the gate insulating film 104 and the oxide semiconductor layer 106, and a conductive layer 108 which is to be wiring layers 112 later are formed over the protective conductive film 107 (see FIG. 1C).

The protective conductive film 107 protects the oxide semiconductor layer 106 provided below the conductive layer 108 when the wiring layers 112 are formed by etching the conductive layer 108. Examples of a conductive material included in the protective conductive film 107 include tungsten (W), molybdenum (Mo), and the like. Examples of a conductive material included in the conductive layer 108 include titanium (Ti), aluminum (Al), tantalum (Ta), and a nitride thereof. Note that the conductive layer 108 may be a single layer or a stack of a plurality of layers. In this embodiment, the conductive layer 108 has a structure in which Ti, Al, and Ti are stacked in this order.

Further, if a metal film in contact with the oxide semiconductor layer 106 is formed using a metal with high oxygen affinity, oxygen is easily extracted from the oxide semiconductor layer 106; thus, the oxide semiconductor layer 106 may have a change in its composition.

Thus, a metal with low oxygen affinity is preferably used for the metal film in contact with the oxide semiconductor layer 106. In this embodiment, the metal film in contact with the oxide semiconductor layer 106 is a tungsten film which is the protective conductive film 107.

The protective conductive film 107 using tungsten has lower oxygen affinity than titanium used as the conductive layer 108. As compared to the case where the Ti film and the oxide semiconductor layer 106 are in contact with each other, oxygen is not easily extracted from the oxide semiconductor layer 106 in the case where the protective conductive film 107 including tungsten is provided. That is, the contact interface between the W film and the oxide semiconductor layer 106 does not easily change in its composition. Therefore, an actual reduction in the thickness of the oxide semiconductor layer 106, due to partly change in composition of the oxide semiconductor layer 106, can be suppressed.

Figure 1D:
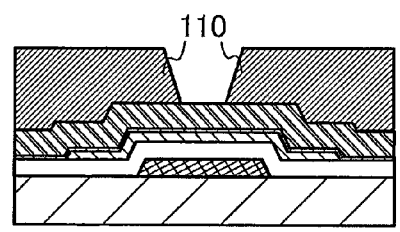

Then, a resist mask 110 is selectively formed over the conductive layer 108 (see FIG. 1D). The resist mask 110 may be formed by a photolithography method.

Next, the conductive layer 108 and the protective conductive film 107 are etched with use of the resist mask 110, so that the wiring layers 112 and conductive layers 114 are formed. The etching process for formation of the wiring layers 112 and the conductive layers 114 includes two steps in order to prevent a reduction in the thickness of the oxide semiconductor layer 106 due to over etching as much as possible.

Figure 1E:
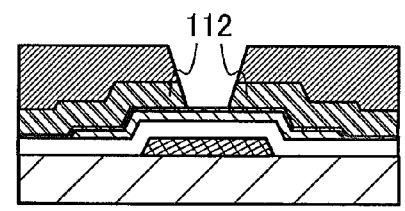

First, the conductive layer 108 is selectively etched with use of the resist mask 110 until the protective conductive film 107 is exposed (a first etching step). In this step, the conductive layer 108 is etched to be the wiring layers 112, and the wiring layers 112 have a function of a source electrode and a drain electrode (see FIG. 1E).

Note that the first etching step is performed under the conditions that the protective conductive film 107 is less etched than the conductive layer 108 and the etching selectivity of the conductive layer 108 to the protective conductive film 107 is high. For example, a chlorine-based gas can be used as an etching gas. Here, as an example of the chlorine-based gas, a $CCl_4$ gas, a $SiCl_4$ gas, a $BCl_3$ gas, a $Cl_2$ gas, or the like can be given. Specifically, a mixed gas of a $BCl_3$ gas and a $Cl_2$ gas is preferably used.

Figure 1F:
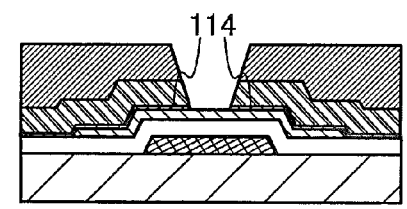

Then, the protective conductive film 107 is selectively etched until the oxide semiconductor layer 106 is exposed (a second etching step). In this step, the protective conductive film 107 is etched to be the conductive layers 114 (see FIG. 1F). Note that it is preferable that the protective conductive film 107 be removed so as not to leave a residue in a region of the exposed oxide semiconductor layer 106 and the oxide semiconductor layer 106 be not etched by the second etching step.

The second etching step is performed under the conditions that the protective conductive film 107 is more easily etched than the oxide semiconductor layer 106 and the etching selectivity of the protective conductive film 107 to the oxide semiconductor layer 106 is high. For example, a mixed gas of a chlorine-based gas and a fluorine-based gas can be used as an etching gas. Here, as the mixed gas of a chlorine-based gas and a fluorine-based gas, a mixed gas of $SF_6$ and $Cl_2$ is particularly preferable.

As described above, with the protective conductive film 107, while the thickness of a portion to be a channel formation region in the oxide semiconductor layer 106 is kept, the wiring layers 112 can be apart from each other by the portion to be a channel formation region. By forming the wiring layers 112 using such an etching method, variation in thickness of the portion to be a channel formation region in the oxide semiconductor layer 106 within the substrate plane can be small even when the substrate 100 has a large area.

Figure 1G:
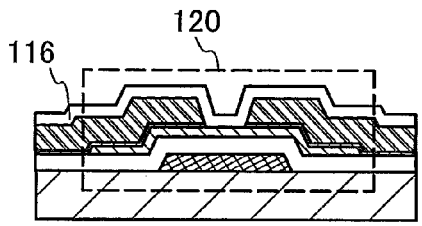

Then, the resist mask 110 is removed. Further, it is preferable that the insulating film 116 be formed over the oxide semiconductor layer, the protective conductive film, and the wiring layer. Through the above steps, a transistor 120 of this embodiment is completed (see FIG. 1G). The insulating film 116 is preferably formed using silicon oxide, silicon nitride, silicon oxynitride or the like by a sputtering method. Furthermore, the insulating film 116 can be formed using a material similar to that of the gate insulating film 104.

After the insulating film 116 is formed, the fourth heat treatment is preferably performed in an inert gas atmosphere or an oxygen atmosphere. The temperature of the heat treatment is set to be higher than or equal to 200° C. to lower than or equal to 450° C., preferably higher than or equal to 250° C. and lower than or equal to 350° C. For example, the heat treatment may be performed at 250° C. for an hour in a nitrogen atmosphere. By performing the fourth heat treatment, variation in electrical characteristics among the transistors can be reduced. Further, in the case where the insulating film 116 contains oxygen, oxygen is supplied to the oxide semiconductor layer 106 which has been dehydrated or dehydrogenated to compensate for oxygen deficiency in the oxide semiconductor layer 106, so that an i-type (intrinsic) or substantially i-type oxide semiconductor layer can be formed.

In this embodiment, the fourth heat treatment is performed after the insulating film 116 is formed; however, the timing of the fourth heat treatment is not limited to this. For example, the fourth heat treatment may be performed following the third heat treatment, the third heat treatment may double as the fourth heat treatment, or the fourth heat treatment may double as the third heat treatment.

With use of the above formation method, a transistor including the oxide semiconductor layer 106 which is a highly purified oxide semiconductor layer, can decrease the off-state current value (off current value) to a level under 10 zA/μm per 1 μm of the channel width, under 100 zA/μm at 85° C. That is, the off-state current can be lowered to be around the measurement limit or below the measurement limit.

According to an embodiment of a semiconductor device disclosed in this specification, a transistor having high performance and high reliability can be manufactured.

This embodiment can be combined as appropriate with any of the other embodiments.

Embodiment 2

The present invention is not limited to the description in Embodiment 1. For example, a semiconductor device disclosed in this specification may have a top-gate structure in which a gate electrode layer is provided over a wiring layer.

Figure 2A:
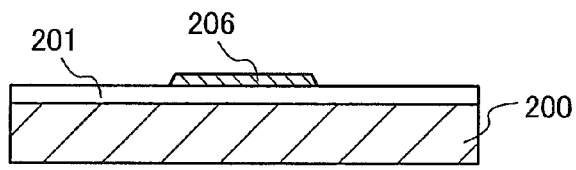
FIGS. 2A to 2F are cross-sectional views illustrating a manufacturing method of a semiconductor device.

First, a base insulating layer 201 is preferably formed over a substrate 200, and an oxide semiconductor layer 206 is selectively formed over the base insulating layer 201 (see FIG. 2A).

The substrate 200 may be the same as the substrate 100 in Embodiment 1.

The base insulating layer 201 can be formed using a material and a method similar to those of the gate insulating film 104 or the like in Embodiment 1.

The oxide semiconductor layer 206 can be formed using a material and a method similar to those of the oxide semiconductor layer 106 in Embodiment 1.

Figure 2B:
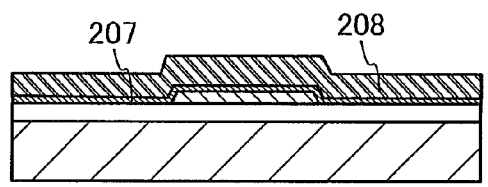

Next, a protective conductive film 207 is formed to cover the base insulating layer 201 and the oxide semiconductor layer 206, and a conductive layer 208 to be wiring layers 212 later is formed over the protective conductive film 207 (see FIG. 2B).

The protective conductive film 207 can be formed using a material and a method similar to those of the protective conductive film 107 in Embodiment 1. The conductive layer 208 can be formed using a material and a method similar to those of the conductive layer 108 in Embodiment 1. In this embodiment, the conductive layer 208 has a structure in which Ti, Al, and Ti are stacked in this order.

Further, when a metal film in contact with the oxide semiconductor layer is formed using a metal with high oxygen affinity, oxygen is easily extracted from the oxide semiconductor layer; thus, the oxide semiconductor layer may have a change in its composition.

Thus, a metal with low oxygen affinity is preferably used for the metal film in contact with the oxide semiconductor layer. In this embodiment, the metal film in contact with the oxide semiconductor layer is a W film which is the protective conductive film.

The protective conductive film using tungsten has lower oxygen affinity than titanium used as the conductive layer 208. As compared to the case where the titanium film and the oxide semiconductor layer are in contact with each other, oxygen is less extracted from the oxide semiconductor layer in the case where the protective conductive film including tungsten is provided. That is, a contact interface between the tungsten film and the oxide semiconductor layer does not easily change in its composition. Therefore, an actual reduction in the thickness of the oxide semiconductor layer, due to partly change in composition of the oxide semiconductor layer, can be suppressed.

Figure 2C:
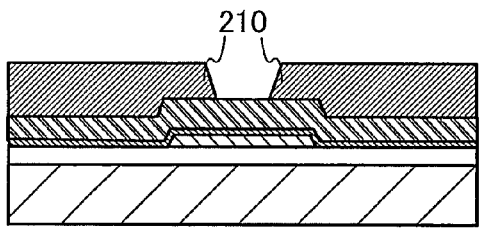

Next, a resist mask 210 is selectively formed over the conductive layer 208 (see FIG. 2C). The resist mask 210 can be formed by a photolithography method as the resist mask 110 in Embodiment 1.

Next, the conductive layer 208 and the protective conductive film 207 are etched with use of the resist mask 210, so that the wiring layers 212 and conductive layers 214 are formed. The wiring layers 212 form at least a source electrode and a drain electrode. The etching process for formation of the wiring layers 212 and the conductive layers 214 includes two steps in order to prevent a reduction in the thickness of the oxide semiconductor layer 206 due to over etching as much as possible.

Figure 2D:
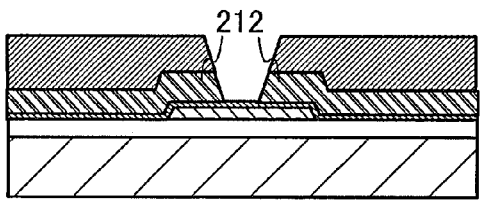

First, the conductive layer 208 is selectively etched with use of the resist mask 210 until the protective conductive film 207 is exposed (a first etching step). In this step, the conductive layer 208 is etched to be the wiring layers 212 (see FIG. 2D).

Note that the first etching step is performed under the conditions that the protective conductive film 207 is less etched than the conductive layer 208 and the etching selectivity of the conductive layer 208 to the protective conductive film 207 is high. For example, a chlorine-based gas can be used as an etching gas. Here, as an example of the chlorine-based gas, a $CCl_4$ gas, a $SiCl_4$ gas, a $BCl_3$ gas, or a $Cl_2$ gas can be given. Specifically, a mixed gas of a $BCl_3$ gas and a $Cl_2$ gas is preferably used.

Figure 2E:
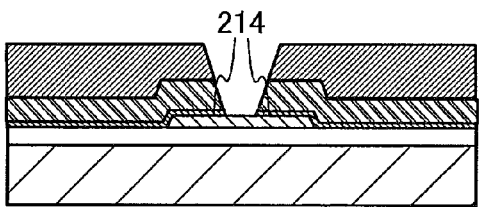

Then, the protective conductive film 207 is selectively etched until the oxide semiconductor layer 206 is exposed (a second etching step). In this step, the protective conductive film 207 is etched to be the conductive layers 214 (see FIG. 2E). Note that it is preferable that the protective conductive film 207 be removed so as not to leave a residue in a region of the exposed oxide semiconductor layer 206 and the oxide semiconductor layer 206 be not etched by the second etching step.

The second etching step is performed under the conditions that the protective conductive film 207 is more easily etched than the oxide semiconductor layer 206 and the etching selectivity of the protective conductive film 207 to the oxide semiconductor layer 206 is high. For example, a mixed gas of a chlorine-based gas and a fluorine-based gas can be used as an etching gas. Here, as the mixed gas of a chlorine-based gas and a fluorine-based gas, a mixed gas of $SF_6$ and $Cl_2$ is particularly preferable.

As described above, with the protective conductive film 207, while the thickness of a portion to be a channel formation region in the oxide semiconductor layer 206 is kept, the wiring layers 212 can be apart from each other by the portion to be a channel formation region. By forming the wiring layers 212 using such an etching method, variation in thickness of the portion to be a channel formation region in the oxide semiconductor layer 206 within the substrate plane can be small even when the substrate 200 has a large area.

Figure 2F:
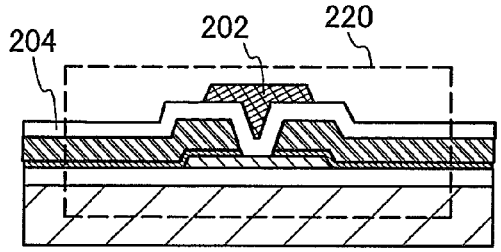

Then, the resist mask 210 is removed. Further, a gate insulating film 204 is formed over the oxide semiconductor layer, the protective conductive film, and the wiring layers, and a gate electrode layer 202 is formed to overlap with the oxide semiconductor layer 206. Through the above steps, a transistor 220 of this embodiment is completed (see FIG. 2F). The gate insulating film 204 can be formed using a material and a method similar to those of the gate insulating film 104 or the like in Embodiment 1, and the gate electrode layer 202 can be formed using a material and a method similar to those of the gate electrode layer 102 or the like in Embodiment 1.

Note that the oxide semiconductor layer is highly purified also in this embodiment. A transistor including the oxide semiconductor layer 206, which is a highly purified oxide semiconductor layer, can decrease the off-state current value (off current value) to a level under 10 zA/μm per 1 μm of the channel width, under 100 zA/μm at 85° C. That is, the off-state current can be lowered to be around the measurement limit or below the measurement limit.

According to one embodiment of a semiconductor device disclosed in this specification, a transistor having high performance and high reliability can be manufactured.

This embodiment can be combined as appropriate with any of the other embodiments.

The present invention is not limited to the embodiments described in Embodiment 1 and Embodiment 2, and can be changed as appropriate within the range without depart from the spirit of the present invention.

Embodiment 3

In this embodiment, the appearance and a cross section of a liquid crystal display panel, which corresponds to one embodiment of a semiconductor device, will be described with reference to FIGS. 3A to 3C. The liquid crystal display panel illustrated in FIGS. 3A to 3C includes the transistor described in Embodiment 1; however, the liquid crystal display can include the transistor described in any of Embodiments 1 and 2. FIGS. 3A and 3C are plan views of panels in each of which a transistor 4010, a transistor 4011, and a liquid crystal element 4013 are sealed between a first substrate 4001 and a second substrate 4006 with a sealant 4005. FIG. 3B is a cross-sectional view taken along the line M-N in FIG. 3A or FIG. 3C.

The sealant 4005 is provided to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008 by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that the connection method of the driver circuit which is separately formed is not particularly limited, and a COG method, a wire bonding method, a TAB method, or the like can be used. FIG. 3A illustrates an example in which the signal line driver circuit 4003 is mounted by a COG method. FIG. 3C illustrates an example in which the signal line driver circuit 4003 is mounted by a TAB method.

The pixel portion 4002 and the scan line driver circuit 4004 provided over the first substrate 4001 include a plurality of transistors. FIG. 3B illustrates the transistor 4010 included in the pixel portion 4002 and the transistor 4011 included in the scan line driver circuit 4004, as an example. An insulating layer 4041, an insulating layer 4042, and an insulating layer 4021 are provided over the transistor 4010 and the transistor 4011 in FIG. 3B.

The transistor described in Embodiment 1 or 2 can be applied to the transistor 4010 and the transistor 4011. In this embodiment, the transistor 4010 and the transistor 4011 are n-channel transistors.

A pixel electrode layer 4030 included in the liquid crystal element 4013 is electrically connected to the transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 serving as alignment films, respectively, and the liquid crystal layer 4008 is sandwiched between the pixel electrode layer 4030 and the counter electrode layer 4031 with the insulating layers 4032 and 4033 interposed therebetween.

Note that as the first substrate 4001 and the second substrate 4006, a light-transmitting substrate, for example, a plastic substrate such as a polyester film or an acrylic resin film, a glass substrate, or a ceramic substrate can be used.

A columnar spacer 4035, which can be obtained in such a manner that an insulating layer is selectively etched, is provided to keep a distance (a cell gap) between the pixel electrode layer 4030 and the counter electrode layer 4031. Alternatively, a spherical spacer may also be used. The counter electrode layer 4031 is electrically connected to a common potential line provided over the same substrate as the transistor 4010. With use of the common connection portion, the counter electrode layer 4031 and the common potential line can be electrically connected to each other by conductive particles arranged between a pair of substrates. Note that the conductive particles are included in the sealant 4005.

Alternatively, liquid crystal exhibiting a blue phase for which an alignment film is unnecessary may be used. In that case, since a horizontal electric field mode is used, the arrangement of the electrodes are different from that illustrated in FIGS. 3A to 3C. For example, the pixel electrode layer and the common electrode layer are arranged over the same insulating layer, and a horizontal electric field is applied to the liquid crystal layer. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer 4008 in order to increase the temperature range. The liquid crystal composition which includes a liquid crystal showing a blue phase and a chiral agent has a short response time of 1 msec or less, has optical isotropy, which makes the alignment process unneeded, and has a small viewing angle dependence.

Note that this embodiment can also be applied to a transflective liquid crystal display device in addition to a transmissive liquid crystal display device.

An example of the liquid crystal display device will be described in which a polarizing plate is provided on the outer surface of the substrate (on the viewer side) and a coloring layer (color filter) and an electrode layer used for a display element are provided on the inner surface of the substrate in this order; however, the polarizing plate may be provided on the inner surface of the substrate. The stack structure of the polarizing plate and the coloring layer is not limited to that described in this embodiment and may be set as appropriate depending on materials of the polarizing plate and the coloring layer or conditions of manufacturing steps. Further, a light-blocking film serving as a black matrix may be provided in a portion other than the display portion.

Over the transistor 4011 and the transistor 4010, the insulating layer 4041 is formed in contact with the oxide semiconductor layers. A protective insulating layer 4042 is formed over and in contact with the insulating layer 4041. In order to reduce the surface roughness caused by the transistors, the insulating layer 4021 serving as a planarization insulating film is formed to cover the protective insulating layer 4042.

The insulating layer 4021 is formed as the planarization insulating film. As the insulating layer 4021, an organic material having heat resistance such as polyimide, acrylic, benzocyclobutene, polyamide, or epoxy can be used. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed of these materials.

A formation method of the insulating layer 4021 is not particularly limited, and the following method can be employed depending on the material: a sputtering method, an SOG method, a spin coating method, a dipping method, a spray coating method, a droplet discharge method (e.g., an ink jet method, screen printing, offset printing, or the like). Further, a doctor knife, a roll coater, a curtain coater, a knife coater, or the like can be used. The baking step of the insulating layer 4021 doubles as annealing of the semiconductor layer, whereby a semiconductor device can be manufactured efficiently.

Each of the pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added. Note that a material including 1 to 10 graphene sheets (which corresponds to one layer of graphite) may be used.

In addition, various signals and potentials are supplied to the signal line driver circuit 4003 which is formed separately, the scan line driver circuit 4004, and the pixel portion 4002 from an FPC 4018.

In addition, a connection terminal electrode 4015 is formed with the same conductive film as the pixel electrode layer 4030 included in the liquid crystal element 4013, and a terminal electrode 4016 is formed with the same conductive film as source and drain electrodes of the transistor 4010 and the transistor 4011.

The connection terminal electrode 4015 is electrically connected to a terminal included in the FPC 4018 via an anisotropic conductive film 4019.

Note that FIGS. 3A to 3C illustrate an example in which the signal line driver circuit 4003 is formed separately and mounted on the first substrate 4001, but this is a non-limiting example. The scan line driver circuit may be separately formed and then mounted, or only part of the signal line driver circuit or part of the scan line driver circuit may be separately formed and then mounted.

The liquid crystal display panel described in this embodiment includes transistors having favorable electric characteristics and high reliability described in Embodiment 1 or Embodiment 2; therefore, the liquid crystal display panel having favorable quality can be provided.

The methods and structures described in this embodiment can be combined as appropriate with any of the methods and structures described in the other embodiments.

Embodiment 4

In this embodiment, an example of electronic paper will be described as one embodiment of a semiconductor device.

The transistor described in Embodiment 1 or Embodiment 2 can be used for electronic paper in which electronic ink is driven by an element electrically connected to a switching element. The electronic paper is also referred to as an electrophoretic display device (an electrophoretic display) and is advantageous in that it is easy to read as if readers read a book of plain paper, it has lower power consumption than other display devices, and it can be made thin and lightweight.

Electrophoretic displays can have various modes. Electrophoretic displays contain a plurality of microcapsules dispersed in a solvent or a solute, and each microcapsule contains first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display is a display that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

In addition, if a plurality of the above microcapsules are arranged as appropriate over an active matrix substrate so as to be interposed between two electrodes, an active matrix display device can be completed, and display can be performed by application of an electric field to the microcapsules. For example, the active matrix substrate with use of transistors described in Embodiment 1 or 2 can be used.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

Figure 4:
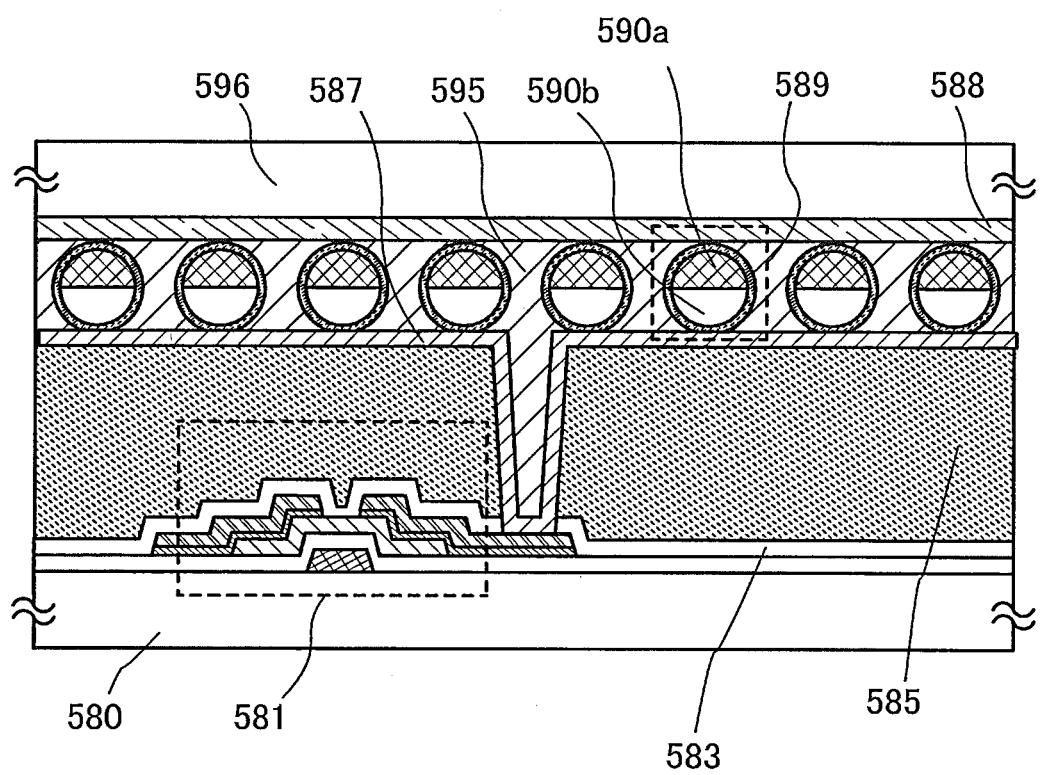
FIG. 4 is a cross-sectional view of a semiconductor device.

FIG. 4 illustrates active matrix electronic paper as an example of a semiconductor device. A transistor 581 used for the semiconductor device can be manufactured in a manner similar to that of the transistor described in Embodiment 1 or Embodiment 2 and thus has favorable electric characteristics and high reliability.

The electronic paper in FIG. 4 is an example of a display device using a twisting ball display system. The twisting ball display system refers to a method in which spherical particles each colored in white and black are arranged between a first electrode layer and a second electrode layer which are electrode layers used for a display element, and a potential difference is generated between the first electrode layer and the second electrode layer to control the orientation of the spherical particles, so that display is performed.

In FIG. 4, the transistor 581 is a bottom-gate transistor. The transistor described in Embodiment 1 or Embodiment 2 can be used for the transistor 581.

A source electrode or a drain electrode of the transistor 581 is in contact with and is electrically connected to the first electrode layer 587 in an opening formed in an insulating layer 583 and an insulating layer 585. Between the first electrode layer 587 and a second electrode layer 588, spherical particles 589 each having a black region 590a and a white region 590b around which is filled with liquid, are provided between a pair of substrates 580 and 596. A space around the spherical particles 589 is filled with a filler 595 such as a resin.

In addition, the first electrode layer 587 corresponds to a pixel electrode, and the second electrode layer 588 corresponds to a common electrode. The second electrode layer 588 is electrically connected to a common potential line provided over the same substrate as the transistor 581. With use of a common connection portion, the second electrode layer 588 and the common potential line can be electrically connected to each other through conductive particles arranged between the pair of substrates 580 and 596.

Further, instead of the twisting ball, an electrophoretic element can also be used. A microcapsule having a diameter of about 10 µm to 200 µm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and the black microparticles move to opposite sides, so that white or black can be displayed. A display element using this principle is an electrophoretic display element, and is generally called electronic paper. The electrophoretic display element has higher reflectivity than a liquid crystal display element, and thus, an auxiliary light is unnecessary, power consumption is low, and a display portion can be recognized in a dim place. Further, even when power is not supplied to the display portion, an image which has been displayed once can be maintained. Accordingly, a displayed image can be stored even if a semiconductor device having a display function (which may simply be referred to as a display device or a semiconductor device provided with a display device) is distanced from an electric wave source.

Through the above steps, electronic paper including any of the transistors described in Embodiment 1 or Embodiment 2 can be manufactured. The electronic paper described in this embodiment includes the transistor having favorable electric characteristics and high reliability described in Embodiment 1 or Embodiment 2; therefore, the electronic paper having favorable quality can be provided.

This embodiment can be implemented in appropriate combination with any of the structures described in the other embodiments.

Embodiment 5

In this embodiment, as an example of a semiconductor device, a memory medium (a memory element) will be described. In this embodiment, the transistor using an oxide semiconductor described in Embodiment 1 and a transistor including a material other than an oxide semiconductor are formed on one substrate.

Figure 5A:
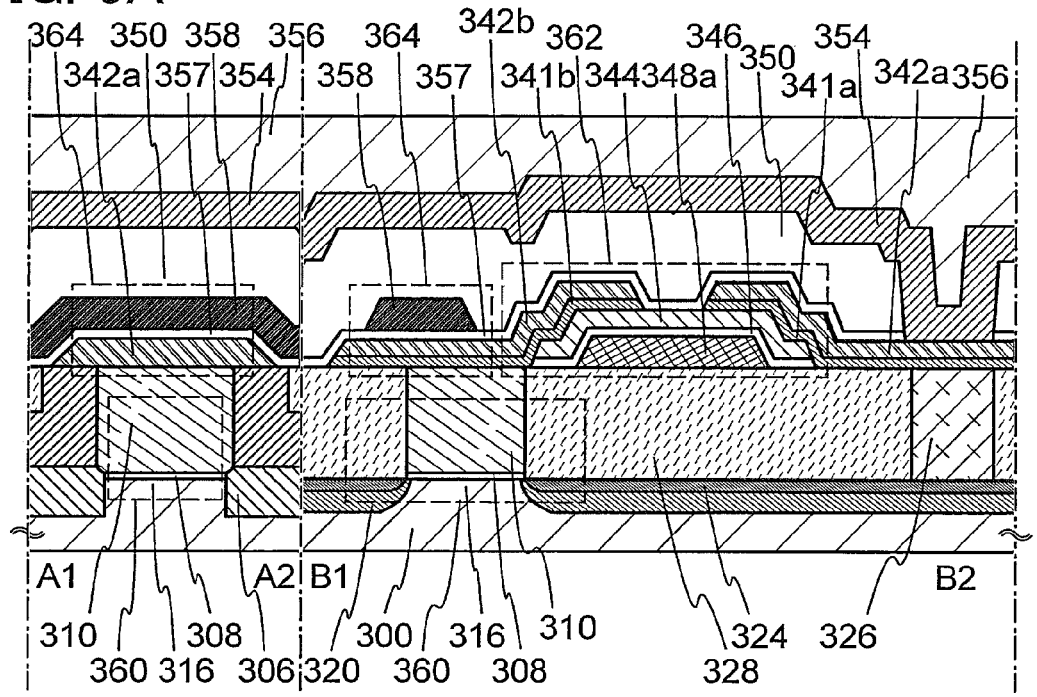
FIGS. 5A to 5C are a cross-sectional view, a top view, and a circuit diagram of a semiconductor device, respectively.
Figure 5B:
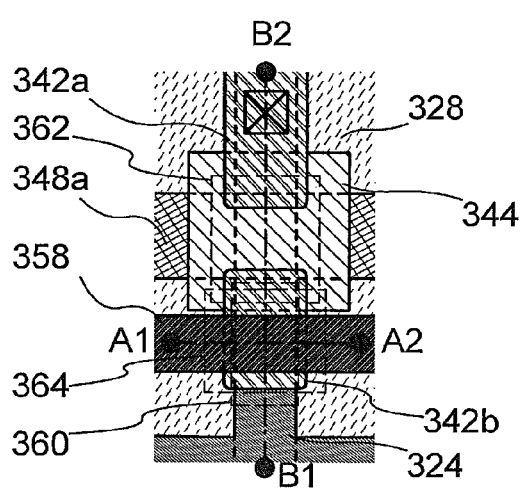
Figure 5C:
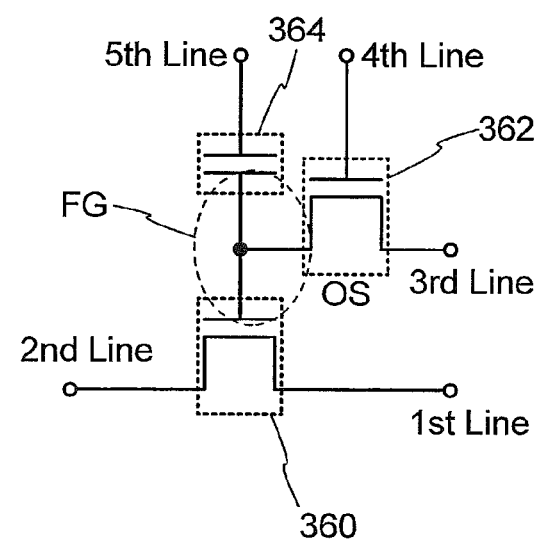

FIGS. 5A to 5C illustrate an example of a structure of a semiconductor device. FIG. 5A illustrates a cross section of the semiconductor device, and FIG. 5B illustrates a plan view of the semiconductor device. Here, FIG. 5A illustrates a cross section taken along the line A1-A2 and the line B1-B2 in FIG. 5B. In addition, FIG. 5C illustrates an example of a diagram of a circuit including the semiconductor device as a memory element. The semiconductor device illustrated in FIGS. 5A and 5B includes a transistor 360 including a first semiconductor material in a lower portion, and a transistor 362 including a second semiconductor material in an upper portion. In this embodiment, the first semiconductor material is a semiconductor material other than an oxide semiconductor, and the second semiconductor material is an oxide semiconductor. As the semiconductor material other than an oxide semiconductor, for example, silicon, germanium, silicon germanium, silicon carbide, gallium arsenide, or the like can be used, and a single crystal semiconductor is preferably used. A transistor including such a semiconductor material other than an oxide semiconductor can operate at high speed easily. On the other hand, a transistor including an oxide semiconductor can hold charge for a long time owing to its characteristics.

The transistor 360 in FIGS. 5A to 5C includes a channel formation region 316 provided in a substrate 300 including a semiconductor material (e.g., silicon); impurity regions 320 provided so that the channel formation region 316 is sandwiched therebetween; metal compound regions 324 in contact with the impurity regions 320; a gate insulating film 308 provided over the channel formation region 316; and a gate electrode 310 provided over the gate insulating film 308.

As the substrate 300 including a semiconductor material, a single crystal semiconductor substrate or a polycrystalline semiconductor substrate made of silicon, silicon carbide, or the like; a compound semiconductor substrate made of silicon germanium or the like; an SOI substrate; or the like can be used. Note that although the term "SOI substrate" generally means a substrate in which a silicon semiconductor layer is provided on an insulating surface, the term "SOI substrate" in this specification and the like also includes a substrate in which a semiconductor layer including a material other than silicon is provided on an insulating surface. That is, a semiconductor layer included in the "SOI substrate" is not limited to a silicon semiconductor layer. Moreover, the term "SOI substrate" can include a substrate having a structure in which a semiconductor layer is provided over an insulating substrate such as a glass substrate, with an insulating layer interposed therebetween.

An electrode 326 is connected to part of the metal compound region 324 of the transistor 360. Here, the electrode 326 functions as a source electrode or a drain electrode of the transistor 360. Further, an element isolation insulating layer 306 is formed so as to surround the transistor 360, and an insulating layer 328 is formed to cover the transistor 360. Note that in order to realize high integration, as illustrated in FIGS. 5A to 5C, preferably, the transistor 360 does not have a sidewall insulating layer. On the other hand, in the case where the characteristics of the transistor 360 have priority, sidewall insulating layers may be provided on side surfaces of a gate electrode 310, and the impurity regions 320 may each include regions with different impurity concentrations.

The transistor 360 can be manufactured by a known technique. The transistor 360 using silicon, germanium, silicon germanium, silicon carbide, gallium arsenide, or the like as a semiconductor material has a feature of high-speed operation. Thus, when the transistor is used as a reading transistor, data can be read at a high speed.

After the transistor 360 is formed, as treatment prior to the formation of the transistor 362 and a capacitor 364, the insulating layer 328 is subjected to CMP treatment so that the top surface of the gate electrode 310 is exposed. As treatment for exposing the upper surface of the gate electrode 310, etching treatment or the like can also be employed instead of CMP treatment; in order to improve characteristics of the transistor 362, a surface of the insulating layer 328 are preferably made as flat as possible.

Next, a conductive layer is formed over the gate electrode 310, the insulating layer 328, and the like and is selectively etched to form a gate electrode 348a of the transistor 362. The transistor 362 of the semiconductor device illustrated in FIGS. 5A to 5C includes the gate electrode 348a, a gate insulating film 346 covering the gate electrode 348a, an oxide semiconductor layer 344 provided over the gate insulating film 346 so as to overlap with the gate electrode 348a, a conductive film 341a, a source electrode 342a, a conductive film 341b, and a drain electrode 342b which are electrically connected to the oxide semiconductor layer 344. The details thereof can be referred to for the description of the transistor in Embodiment 1 or Embodiment 2. In addition, the gate insulating film 346 is provided so as to overlap with the oxide semiconductor layer 344 in FIGS. 5A to 5C; however, without being limited thereto, the gate insulating film 346 may be provided so as to cover at least the gate electrode 348a, and so that the electrode 326, the conductive film 341a, and the source electrode 342a are electrically connected to each other and the gate electrode 310 the conductive film 341b, and the drain electrode 342b are electrically connected to each other.

In the semiconductor device illustrated in FIGS. 5A to 5C, an insulating layer 357 is formed over the transistor 362, and a conductive layer 358 is provided so as to overlap with at least the drain electrode 342b, over the insulating layer 357. In other words, the conductive layer 358 has a function of one electrode of the capacitor 364. Here, the insulating layer 357 can be formed with a material similar to that of the gate insulating film 346, and the conductive layer 358 can be formed with a material similar to that of the gate electrode 348a.

In addition, an insulating layer 350 is provided over the insulating layer 357 and the conductive layer 358. A wiring 354 is provided over the insulating layer 350, and the wiring 354 is connected to the source electrode 342a in the opening formed in the gate insulating film 346, the insulating layer 350, and the like. Here, the wiring 354 is provided so as to overlap with at least part of the oxide semiconductor layer 344 of the transistor 362.

In the semiconductor device illustrated in FIGS. 5A to 5C, the transistor 360 and the transistor 362 are provided so as to overlap at least partly with each other. In particular, the transistor 360 and the transistor 362 are provided in such manner that the source region or the drain region of the transistor 360 overlaps with at least part of the oxide semiconductor layer 344. In addition, the wiring 354 is provided so as to overlap with at least part of the oxide semiconductor layer 344. In addition, the transistor 362 and the capacitor 364 are provided so as to overlap with the transistor 360. For example, the conductive layer 358 of the capacitor 364 is provided to overlap at least partly with the gate electrode 310 of the transistor 360. With such a planar layout, the semiconductor device can be highly integrated. For example, when the memory cell is constituted with use of the semiconductor device, given that the minimum feature size is F, the area occupied by a memory cell can be $15F^2$ to $25F^2$.

FIG. 5C illustrates an example of a diagram of a circuit using the semiconductor device as a memory element. In FIG. 5C, one of a source electrode and a drain electrode of the transistor 362, one electrode of the capacitor 364, and a gate electrode of the transistor 360 are electrically connected to one another. A first wiring (a 1st line, also referred to as a source line) is electrically connected to a source electrode of the transistor 360. A second wiring (a 2nd line, also referred to as a bit line) is electrically connected to a drain electrode of the transistor 360. A third wiring (a 3rd line, also referred to as a first signal line) is electrically connected to the other of the source electrode and the drain electrode of the transistor 362. A fourth wiring (a 4th line, also referred to as a second signal line) is electrically connected to a gate electrode of the transistor 362. A fifth wiring (a 5th line, also referred to as a word line) and the other electrode of the capacitor 364 are electrically connected to each other.

The transistor 362 including an oxide semiconductor has extremely low off-state current; therefore, when the transistor 362 is in an off state, a potential of a node (hereinafter, a node FG) where the one of the source electrode and drain electrode of the transistor 362, the one electrode of the capacitor 364, and the gate electrode of the transistor 360 are electrically connected to one another can be held for an extremely long time. Provision of the capacitor 364 facilitates holding of charge given to the node FG and reading of stored data.

When data is stored in the semiconductor device (writing), first, the potential of the fourth wiring is set to a potential at which the transistor 362 is turned on, whereby the transistor 362 is turned on. Thus, the potential of the third wiring is applied to the node FG and a predetermined amount of charge is accumulated in the node FG. Here, charge for applying either of two different potential levels (hereinafter referred to as low-level charge and high-level charge) is given to the node FG. After that, the potential of the fourth wiring is set to a potential at which the transistor 362 is turned off, whereby the transistor 362 is turned off. This makes the node FG floating and the predetermined amount of charge is held in the node FG. The predetermined amount of charge is thus accumulated and held in the node FG, whereby the memory cell can store data.

Since the off-state current of the transistor 362 is extremely small, the charge applied to the node FG is held for a long period. Accordingly, the refresh operation is not needed or the frequency of the refresh operation can be drastically decreased, which leads to a sufficient reduction in power consumption. Moreover, stored data can be held for a long time even when power is not supplied.

When stored data is read out (reading), while a predetermined potential (a fixed potential) is applied to the first wiring, an appropriate potential (a read-out potential) is applied to the fifth wiring, whereby the transistor 360 changes its state depending on the amount of charge held in the node FG. This is because, in general, when the transistor 360 is an n-channel transistor, an apparent threshold value $V_{th\_H}$ of the transistor 360 in the case where a high-level charge is held in the node FG is lower than an apparent threshold value $V_{th\_L}$ of the transistor 360 in the case where a low-level charge is held in the node FG. Here, the apparent threshold voltage is the potential of the fifth wiring that turns on the transistor 360. Thus, by setting the potential of the fifth wiring to a potential $V_0$ that is between $V_{th\_H}$ and $V_{th\_L}$, the charge held in the node FG can be determined. For example, in the case where a high-level charge is given in writing, when the potential of the fifth line is $V_0$ ($>V_{th\_H}$), the transistor 360 is turned on. In the case where a low-level charge is given in writing, even when the potential of the fifth line is $V_0$ ($<V_{th\_L}$), the transistor 360 remains in an off state. In such a manner, by controlling the potential of the fifth wiring and determining whether the transistor 360 is in an on state or off state (reading out the potential of the second wiring), stored data can be read out.

Further, in order to rewrite stored data, a new potential is applied to the node FG that is holding the predetermined amount of charge given in the writing, so that the charge of the new data is held in the node FG. Specifically, the potential of the fourth wiring is set to a potential at which the transistor 362 is turned on, whereby the transistor 362 is turned on. The potential of the third wiring (a potential of new data) is supplied to the node FG, and the predetermined amount of charge is accumulated in the node FG. After that, the potential of the fourth wiring is set to a potential at which the transistor 362 is turned off, whereby the transistor 362 is turned off. Here the node FG is in a state where a charge for new data is held. In other words, while the predetermined amount of charge given in the first writing is held in the node FG, the same operation (a second writing) as in the first writing is performed, whereby the stored data can be overwritten.

The off-state current of the transistor 362 described in this embodiment can be sufficiently reduced by using the oxide semiconductor layer 344 which has been highly purified to be intrinsic. Then, by using such a transistor, a semiconductor device in which stored data can be held for an extremely long time can be obtained.

In the semiconductor device described in this embodiment, the transistor 360 and the transistor 362 overlap with each other; therefore, a semiconductor device in which the degree of integration is sufficiently improved can be realized.

The methods and structures described in this embodiment can be combined as appropriate with any of the methods and structures described in the other embodiments.

Embodiment 6

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

In this embodiment, examples of an electronic device on which a transistor with favorable electric characteristics and high reliability which can be obtained in any of the above embodiments is mounted will be described with reference to FIGS. 6A to 6E.

Figure 6A:
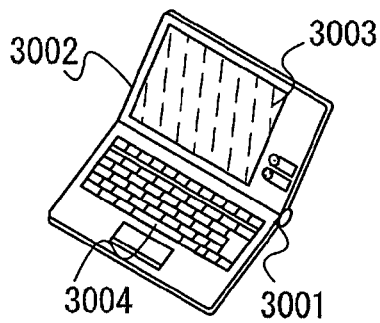
FIGS. 6A to 6E each illustrate an electronic device.

FIG. 6A illustrates a laptop personal computer, which includes a main body 3001, a housing 3002, a display portion 3003, a keyboard 3004, and the like. Note that the laptop personal computer includes the transistor described in any of the above embodiments. Therefore, the laptop computer with favorable quality and high reliability can be realized.

Figure 6B:
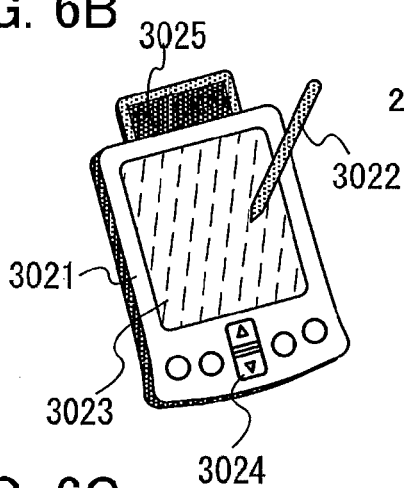

FIG. 6B illustrates a portable information terminal (PDA) including a display portion 3023, an external interface 3025, an operation button 3024, and the like in a main body 3021. A stylus 3022 is included as an accessory for operation. Note that the portable information terminal (PDA) includes the transistor described in any of the above embodiments. Therefore, the portable information terminal (PDA) with favorable quality and high reliability can be realized.

Figure 6C:
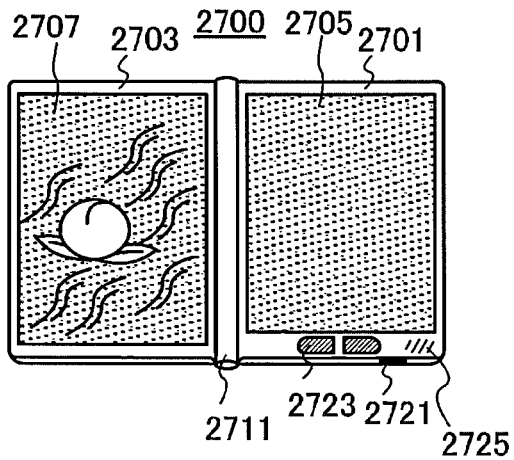

FIG. 6C is an electronic book (e-book reader) manufactured by mounting the electronic paper described in Embodiment 4 as a component. FIG. 6C illustrates an example of an e-book reader. For example, the e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right (the display portion 2705 in FIG. 6C) can display text and a display portion on the left (the display portion 2707 in FIG. 6C) can display images.

FIG. 6C illustrates an example in which the housing 2701 is provided in an operation portion and the like. For example, the housing 2701 is provided with a power switch 2721, operation keys 2723, a speaker 2725, and the like. With the operation keys 2723, pages can be turned. Note that a keyboard, a pointing device, or the like may also be provided on the surface of the housing, on which the display portion is provided. Furthermore, an external connection terminal (an earphone terminal, a USB terminal, a terminal that can be connected to various cables such as a USB cable, an AC adapter, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

Figure 6D:
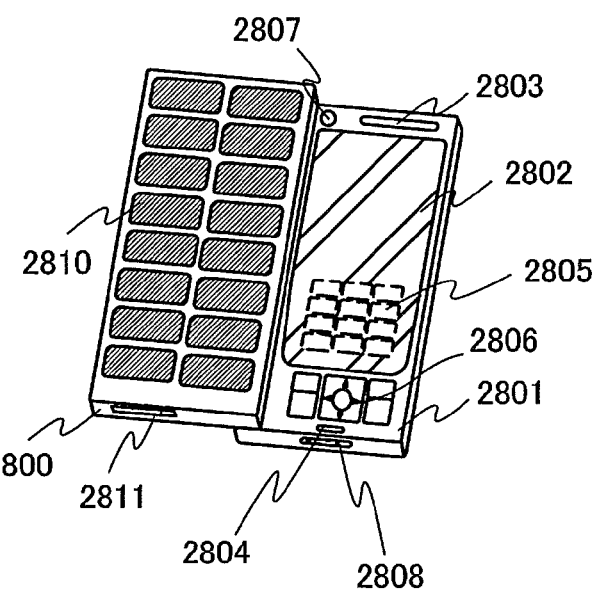

FIG. 6D illustrates a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. The housing 2801 is provided with a solar battery cell 2810 for charging of the portable information terminal, an external memory slot 2811, and the like. Further, an antenna is incorporated in the housing 2801. Note that the mobile phone includes the transistor described in any of the above embodiments at least as a component.

The display panel 2802 is provided with a touch panel. A plurality of operation keys 2805 which is displayed as images is illustrated by dashed lines in FIG. 6D. Note that a boosting circuit by which a voltage output from the solar cell 2810 is increased to be high enough for each circuit is also included.

In the display panel 2802, the display direction can be appropriately changed depending on a usage pattern. Further, the display device is provided with the camera lens 2807 on the same surface as the display panel 2802, and thus it can be used as a video phone. The speaker 2803 and the microphone 2804 can be used for videophone calls, recording, playing sound, and the like as well as voice calls. Moreover, the housings 2800 and 2801 developed as illustrated in FIG. 6D can be slid so that one is lapped over the other; thus, the size of the mobile phone can be reduced, which makes the mobile phone suitable for being carried.

The external connection terminal 2808 can be connected to an AC adapter or various types of cables such as a USB cable, and for example, charging and data communication with a personal computer are possible. Moreover, a larger amount of data can be saved and moved by inserting a recording medium to the external memory slot 2811. As the recording medium, the semiconductor device described in Embodiment 5 can be used. According to Embodiment 5, with use of the transistor in which the off current can be sufficiently reduced, a semiconductor device capable of holding stored data for an extremely long time can be obtained.

Further, in addition to the above functions, an infrared communication function, a television reception function, or the like may be provided.

Figure 6E:
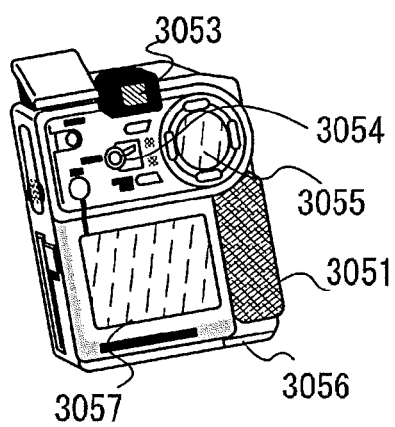

FIG. 6E is a digital camera, which includes a main body 3051, a display portion (A) 3057, an eyepiece 3053, operation switches 3054, a display portion (B) 3055, a battery 3056, and the like. Note that the digital camera includes the transistor described in any of the above embodiments. Therefore, the digital camera with favorable quality and high reliability can be realized.

As described above, the electronic devices described in this embodiment each include the semiconductor device according to any of the above embodiments. Therefore, electronic devices having favorable qualities can be realized.

Example 1

In Example 1, a transistor was manufactured as one example of the transistor in Embodiment 1, and was measured by a scanning transmission electron microscope (STEM). In addition, a STEM image of the cross-sectional shape of the transistor was observed.

A glass substrate was used as the substrate 100 in this example. The gate electrode layer 102 with a thickness of 100 nm was formed with use of a tungsten target in a sputtering apparatus. The gate insulating film 104 with a thickness of 100 nm was formed with use of an oxynitride silicon target in the sputtering apparatus. The oxide semiconductor layer 106 with a thickness of 30 nm was formed in the sputtering apparatus using an In—Ga—Zn-based oxide target ($In_2O_3$: $Ga_2O_3$:ZnO=1:1:2 (molar ratio)) under conditions that the pressure was 0.6 Pa, the direct current (DC) power was 5 kW, the substrate temperature was 200° C., the deposition atmosphere was a mixed atmosphere of argon and oxygen (oxygen:argon=1:1). The protective conductive film 107 with a thickness of 50 nm was formed with use of a tungsten target in the sputtering apparatus.

The conductive layer 108 had a three-layer-stacked structure in which a first conductive film 108A, a second conductive film 108B, and a third conductive film 108C were stacked in this order over the protective conductive film 107. The first conductive film 108A was formed of titanium (Ti) to a thickness of 100 nm, the second conductive film 108B was formed of aluminum (Al) to a thickness of 400 nm, and the third conductive film 108C was formed of titanium (Ti) to a thickness of 100 nm.

In Example 1, two steps of etching were performed with use of an ICP (Inductively Coupled Plasma) device. In this example, as an etching process for processing the conductive layer 108 having the stacked structure of the conductive layers, an etching step (the first etching step) was performed in a mixed gas of $BCl_3$ and $Cl_2$ and then another etching step (the second etching step) was performed in a mixed gas of $SF_6$ and $Cl_2$ to remove the protective conductive film 107.

As the condition for the first etching step, the ICP power is 0 W, the bias power was 1500 W, the pressure was 2.0 Pa, the gas flow rate ratio between $BCl_3$ and $Cl_2$ was 750 sccm:150 sccm, and the etching time was extended for 20 seconds as overetching.

Under the conditions for the first etching step in this example, the etching rate of Ti was 86.10 nm/min, the etching rate of Al was 98.40 nm/min, and the etching rate of W was 12.20 nm/min.

The etching selectivity of the first conductive film 108A in the conductive layer 108 with a stacked structure, which is a Ti film and contact with the protective conductive film 107, to the protective conductive film 107, which is a tungsten film was obtained by dividing the etching rate of the Ti film, 86.10 nm/min, by the etching rate of the W film, 12.20 nm/min. That is, the etching selectivity was 7.06.

As the condition for the second etching step, the ICP power was 2000 W, the bias power was 300 W, the pressure was 1.5 Pa, the gas flow rate ratio between $SF_6$ and $Cl_2$ was 540 sccm:540 sccm, and the etching time was extended for 15 seconds as overetching. Through the above process, the transistor of Example 1 can be manufactured.

The etching rate of tungsten (W) under the condition in this example was 98.40 nm/min and the etching rate of the In—Ga—Zn-based oxide semiconductor was 2.15 nm/min.

The etching selectivity of the protective conductive film 107, which is a tungsten (W) film, to the oxide semiconductor layer 106, which is an In—Ga—Zn-based oxide semiconductor was obtained by dividing the etching rate of the W film, 98.40 nm/min, by the etching rate of the In—Ga—Zn-based oxide semiconductor, 2.15 nm/min. That is, the etching selectivity was 45.77.

A transistor was manufactured as a comparative example in such a manner that the protective conductive film 107 was not provided below the conductive layer 108 and etching for processing the conductive layer 108 with the stacked structure was performed with the mixed gas of $BCl_3$ and $Cl_2$ (the first etching step). The STEM images of the cross-sectional shapes of the transistor in Example 1 and the transistor as the comparative example were observed.

Figure 7:
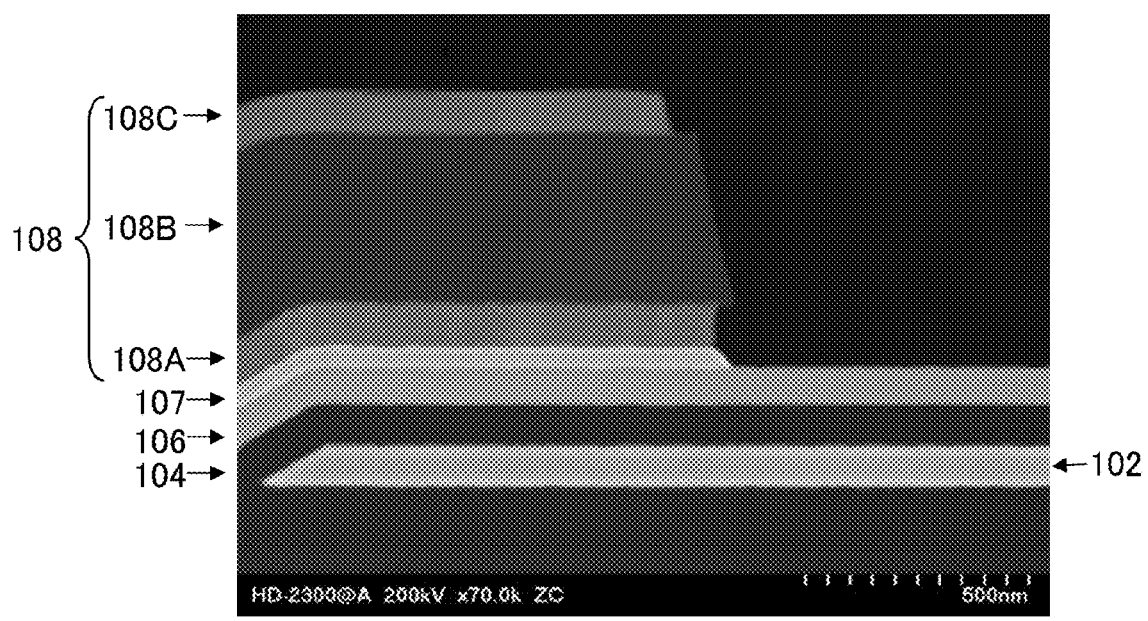
FIG. 7 is an STEM image described in Example 1.
Figure 8:
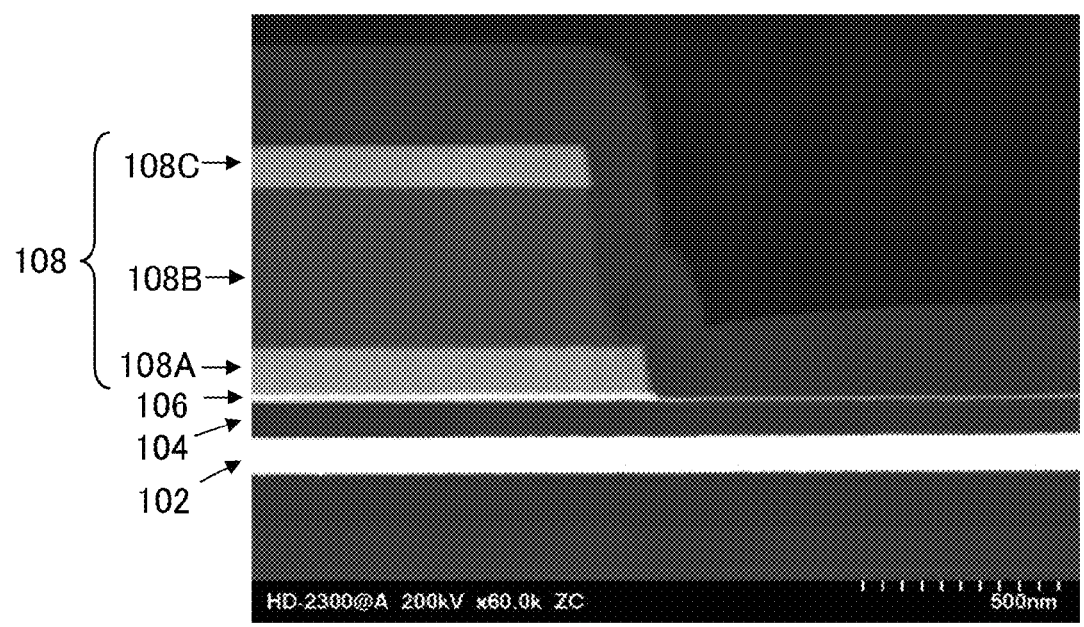
FIG. 8 is an STEM image of a comparison example described in Example 1.

FIG. 7 is a cross-sectional STEM image of a contact portion between the oxide semiconductor layer 106 and the conductive layer 108 in the transistor in Example 1. FIG. 8 is a cross-sectional STEM image of a contact portion between the oxide semiconductor layer 106 and the conductive layer 108 in the transistor as the comparative example.

In the transistor in Example 1, the difference between the thickness of the oxide semiconductor layer not overlapping with the conductive layer 108 (hereinafter, the first film thickness) and the thickness of the oxide semiconductor layer 106 overlapping with the conductive layer 108 (hereinafter, the second film thickness) was little, which was about 1 nm. On the other hand, in the transistor as the comparative example, the difference between the first film thickness and the second film thickness of the oxide semiconductor layer 106 was about 20 nm, because the oxide semiconductor layer 106 was also etched at the same time as the etching of the conductive layer 108.

As described above, the oxide semiconductor layer 106 provided below the conductive layer 108 was etched excessively, by the thickness of 20 nm, in the transistor as the comparative example. In Example 1, however, the oxide semiconductor layer 106 provided below the conductive layer 108 was hardly etched owing to the protective conductive film 107. Accordingly, by the manufacturing method of the transistor in Example 1, because excess etching of the oxide semiconductor layer and variation of the thickness of the oxide semiconductor layer can be suppressed, the productivity can be increased and a transistor can be manufactured with high yield.

Example 2

In Example 2, another example of the second etching step is described. A structure and a manufacturing process of the transistor of this example are similar to those of Example 1, except the conditions of the second etching step. The conditions of the second etching step were as follows: the ICP power was 2000 W, the bias power was 300 W, the pressure was 1.5 Pa, the gas flow rate ratio between $SF_6$ and $Cl_2$ was 450 sccm:630 sccm, and the etching time was extended for 15 seconds as overetching. The transistor of this example was formed as the above conditions, subjected to a measurement with use of STEM, and a STEM image of the cross-sectional shape was observed.

Figure 9:
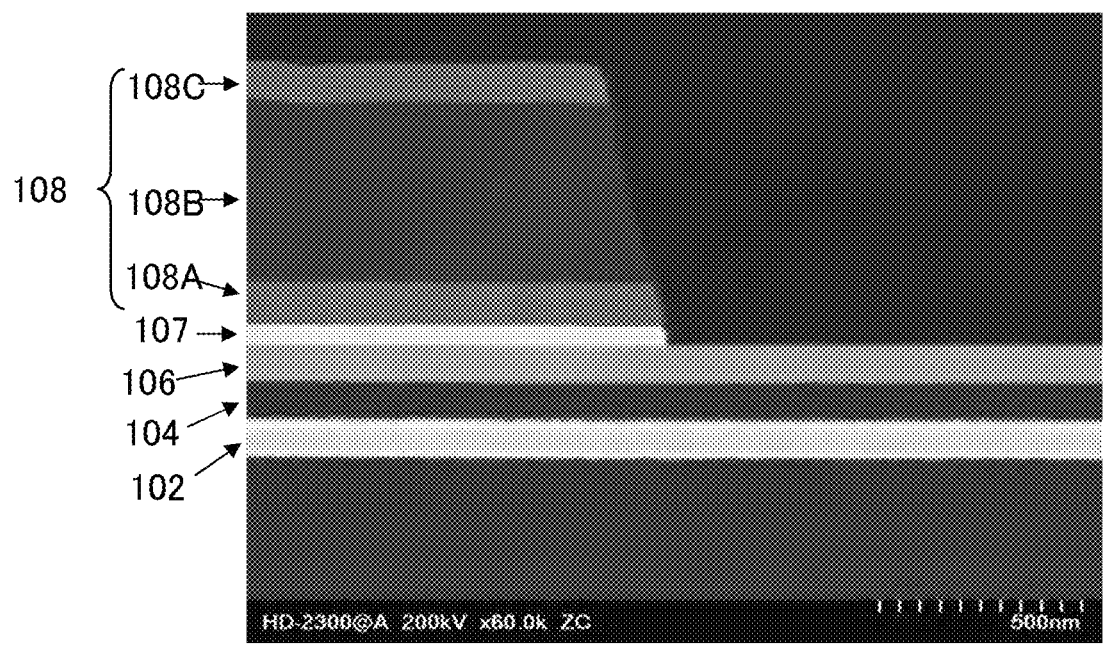
FIG. 9 is an STEM image described in Example 2.

FIG. 9 is a cross-sectional STEM image of a contact portion between the oxide semiconductor layer 106 and the conductive layer 108 in the transistor in Example 2.

In the transistor formed under the conditions of the second etching step in Example 2, the difference between the first film thickness and the second film thickness of the oxide semiconductor layer 106 was little, which was about 1 nm. In Example 2, the oxide semiconductor layer 106 provided below the conductive layer 108 was hardly etched owing to the protective conductive film 107.

Further, as shown in FIG. 9, the end portions of the first conductive film 108A, the second conductive film 108B, and the third conductive film 108C are substantially aligned, so that a continuous end portion of the stacked layer was obtained. When the end portions of the first conductive film 108A, the second conductive film 108B, and the third conductive film 108C have continuous end portion with almost no steps, the coverage of a film formed over the first conductive film 108A, the second conductive film 108B, and the third conductive film 108C can be improved.

As described above, because excess etching of the oxide semiconductor layer and variation of the thickness of the oxide semiconductor layer can be suppressed by the manufacturing method of the transistor in this example, the productivity can be increased and a transistor can be manufactured with high yield. Furthermore, when a process is performed by controlling the etching steps, a favorable shape can be obtained; therefore, leakage current of a transistor can be reduced and thus a high-performance and a high-reliable transistor can be manufactured.

This application is based on Japanese Patent Application serial no. 2010-204685 filed with Japan Patent Office on Sep. 13, 2010, the entire contents of which are hereby incorporated by reference.

What is claimed is:

1. A manufacturing method of a semiconductor device comprising:
   forming an oxide semiconductor layer wherein the oxide semiconductor layer comprises an oxide including crystals;
   forming a first film over the oxide semiconductor layer;
   forming a second film over the first film;
   selectively etching the second film under a condition that the first film is less etched than the second film, so that the first film is exposed; and
   selectively etching the first film under a condition that the first film is more easily etched than the oxide semiconductor layer, so that the oxide semiconductor layer is exposed.

2. The manufacturing method of a semiconductor device according to claim 1, further comprising a step of forming an insulating film over the oxide semiconductor layer, the first film, and the second film.

3. The manufacturing method of a semiconductor device according to claim 1, wherein a thickness of the first film is equal to or less than a thickness of the oxide semiconductor layer.

4. The manufacturing method of a semiconductor device according to claim 1, wherein the second film has a stacked-layer structure including a film including aluminum as a material.

5. The manufacturing method of a semiconductor device according to claim 1, wherein the first film comprises a tungsten film.

6. The manufacturing method of a semiconductor device according to claim 1, wherein the oxide semiconductor layer comprises indium, gallium, and zinc as main components.

7. The manufacturing method of a semiconductor device according to claim 1, further comprising:
   forming a gate electrode layer; and
   forming a gate insulating film over the gate electrode layer before forming the oxide semiconductor layer.

8. The manufacturing method of a semiconductor device according to claim 1, further comprising:
   forming a gate insulating film over the oxide semiconductor layer before selectively etching the first film; and
   forming a gate electrode layer over the gate insulating film to overlap with the oxide semiconductor layer.

9. The manufacturing method of a semiconductor device according to claim 1, wherein the crystals have c-axis alignment.

10. The manufacturing method of a semiconductor device according to claim 1, wherein the first film is conductive.

11. The manufacturing method of a semiconductor device according to claim 1, wherein the second film is conductive.

12. The manufacturing method of a semiconductor device according to claim 1, wherein a thickness of the oxide semiconductor layer is equal to or larger than 3 nm and equal to or smaller than 30 nm.

* * * * *